US008831242B2

(12) United States Patent
Brown et al.

(10) Patent No.: US 8,831,242 B2
(45) Date of Patent: Sep. 9, 2014

(54) DONNED/DOFFED MUTE CONTROL

(71) Applicant: Plantronics, Inc., Santa Cruz, CA (US)

(72) Inventors: William O Brown, Santa Cruz, CA (US); Timothy P Johnston, Los Gatos, CA (US)

(73) Assignee: Plantronics, Inc., Santa Cruz, CA (US)

( * ) Notice: Subject to any disclaimer, the term of this patent is extended or adjusted under 35 U.S.C. 154(b) by 0 days.

(21) Appl. No.: 13/797,126

(22) Filed: Mar. 12, 2013

(65) Prior Publication Data

US 2013/0188805 A1 Jul. 25, 2013

Related U.S. Application Data

(63) Continuation of application No. 12/181,241, filed on Jul. 28, 2008, now abandoned.

(51) Int. Cl.
*H03G 3/20* (2006.01)
*H04R 1/10* (2006.01)

(52) U.S. Cl.
CPC ............... *H03G 3/20* (2013.01); *H04R 1/1041* (2013.01)
USPC .......................................................... 381/74

(58) Field of Classification Search
USPC ........................................... 381/74, 374, 384
See application file for complete search history.

(56) References Cited

U.S. PATENT DOCUMENTS

| 3,109,893 | A | 11/1963 | Burns et al. |
| 4,330,690 | A | 5/1982 | Botros |
| 6,118,878 | A | 9/2000 | Jones |
| 6,118,882 | A | 9/2000 | Haynes |
| 6,704,428 | B1 | 3/2004 | Wurtz |
| 6,965,669 | B2 | 11/2005 | Bickford et al. |
| 7,010,332 | B1* | 3/2006 | Irvin et al. .................. 455/575.2 |
| 2002/0021278 | A1 | 2/2002 | Hinckley et al. |
| 2002/0068537 | A1 | 6/2002 | Shim et al. |
| 2004/0105538 | A1 | 6/2004 | Goebel |
| 2005/0221791 | A1 | 10/2005 | Angelhag |
| 2006/0023865 | A1 | 2/2006 | Nice et al. |
| 2006/0029234 | A1* | 2/2006 | Sargaison ........................ 381/74 |
| 2006/0045304 | A1 | 3/2006 | Lee et al. |
| 2006/0073787 | A1 | 4/2006 | Lair et al. |
| 2007/0004473 | A1 | 1/2007 | Clark et al. |
| 2007/0025579 | A1 | 2/2007 | Kolton |
| 2007/0076897 | A1* | 4/2007 | Philipp ........................... 381/74 |

(Continued)

FOREIGN PATENT DOCUMENTS

| EP | 0564164 | 10/1993 |
| GB | 2341725 A | 3/2000 |

(Continued)

OTHER PUBLICATIONS

International Search Report and Written Opinion of the International Search Authority mailed Jan. 22, 2010 in Application No. PCT/US2009/051877.

*Primary Examiner* — David Vu
*Assistant Examiner* — Jonathan Han

(57) ABSTRACT

Methods and apparatuses for headset wearing mode based operation are presented. A headset system includes a first earbud and a second earbud. One or both earbuds have a detector which indicates whether the earbud is donned or doffed. Operation of the headset is modified based on the donned or doffed status of the earbuds.

15 Claims, 24 Drawing Sheets

(56) References Cited

U.S. PATENT DOCUMENTS

| | | |
|---|---|---|
| 2007/0121959 A1 | 5/2007 | Philipp |
| 2007/0297634 A1 | 12/2007 | Hansson |
| 2008/0080705 A1 | 4/2008 | Gerhardt et al. |
| 2008/0166002 A1 | 7/2008 | Amsel |
| 2009/0154720 A1 | 6/2009 | Oki |
| 2009/0249478 A1 | 10/2009 | Rosener et al. |
| 2012/0189136 A1 | 7/2012 | Brown et al. |

FOREIGN PATENT DOCUMENTS

| | | |
|---|---|---|
| GB | 2357400 | 6/2001 |
| JP | 2002-278785 | 10/2000 |
| WO | WO 00/76177 | 12/2000 |
| WO | WO 01/63888 | 8/2001 |
| WO | WO 03/103175 | 12/2003 |
| WO | WO 2005/099105 | 10/2005 |
| WO | WO 2007/110807 A2 | 10/2007 |
| WO | WO 2008/045180 A1 | 4/2008 |

* cited by examiner

DONNED/DOFFED MUTE CONTROL

CROSS-REFERENCE TO RELATED APPLICATIONS

The present application is a continuation of co-pending U.S. patent application Ser. No. 12/181,241, filed Jul. 28, 2008, entitled "Donned/Doffed Multimedia File Playback Control."

The present application is also related to commonly assigned commonly assigned, co-pending U.S. patent application Ser. No. 12/181,229, filed Jul. 28, 2008, entitled "Headset Wearing Mode Based Operation." The full disclosures of each of these applications are incorporated herein by reference.

BACKGROUND OF THE INVENTION

Users of headsets or headphones often choose not to wear their headset or headphones in an in-the-ears or on-the-ears wearing mode at all times. Instead, users may choose to wear the devices in a body worn stowage mode, such as around their neck, over a shoulder, or elsewhere on the body. As the body-worn stowage wearing mode has become more fashionable, headset and headphones designs have evolved accordingly. These headsets and headphones must be designed to be easily worn while not in use and celebrate the headset or headphones form factor rather than hide it, thereby making it desirable for the user to wear the headset or headphones in plain view.

However, in a body worn stowage wearing mode, headset operation has been limited because it is not worn in the traditional in-the-ears or on-the-ears operational mode. For example, in a body worn stowage wearing mode, a headset ringer is not typically sufficiently loud to hear when played through the ear piece speakers since the ear pieces are not on-the-ears or in-the-ears. In contrast, if the ringer volume is set at a higher level so that it is sufficiently loud to be heard when worn on the body, it would then be too loud when worn in-the-ears or on-the-ears.

Listening to multimedia content is a common use of headsets and headphones. Hearing multimedia content accurately often requires that both the left and right channels be heard. This is typically done by wearing ear pieces in both ears. However, for a number of reasons, simultaneous wearing of two ear pieces is not always desirable. For example, it is illegal to do so while driving an automobile. In an office setting, wearing both ear pieces implies the user is unavailable, which may be considered inappropriate. Furthermore, wearing two ear pieces may interfere with the wearer's capacity to hear outside interrupts such as a desk phone ringing. It may also incorrectly imply that the user is not performing his/her job.

One solution in the prior art is simply for the wearer to remove one ear piece. However, this may be problematic in that one channel (left or right) of the content is lost. The loss of one channel may seriously degrade the listening experience where the left and right channel differ, as is the case for stereo signals or other types of processed or multi-channel signals. It would therefore be desirable to allow the user to remove an earpiece under certain circumstances without losing any audio content.

In another situation, a user may be listening to some form of multimedia such as music and need to talk to somebody nearby or need to listen to something happening in the immediate vicinity. Typically, the user removes his/her earpieces. However, the multimedia continues to play unless the user enters a pause command on the media player user interface. Thus, the user either loses his/her place in the media or has to perform a second action to pause playback.

As a result, there is a need for improved methods and apparatuses for headset or headphones operation based on wearing mode.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Figure 1:
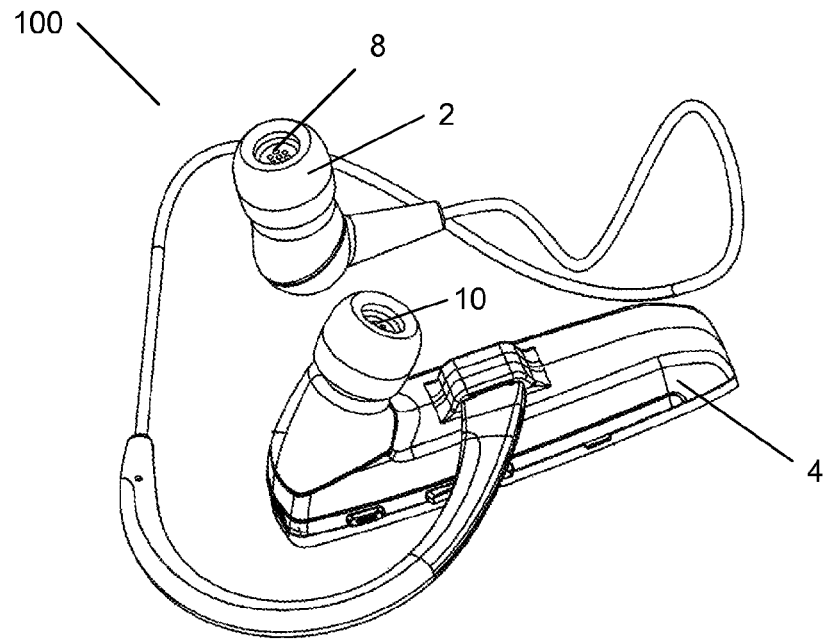
FIG. 1 shows a system including a headset and a detachable earbud in a coupled state.

Methods and apparatuses for headset and headphones operation based on wearing mode are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Generally, this invention relates to telephony, computer telephony, and personal entertainment. The invention applies to body-worn audio devices such as communication headsets and listening headphones.

In one example, the headset or headphones utilize a form factor that allows it to be worn on the body in a stowage mode, such as around the neck or over the shoulder, without both ear pieces in place on or in-the-ears, but still have the ability to provide operational functionality. By having donned/doffed state detection capability in both earpieces of a binaural headset or headphones, the wearing mode can be determined. The wearing mode includes whether the headset or headphones are worn on both ears (both ear pieces donned), worn on one ear (one ear piece donned, one ear piece doffed), on neither ear (both ear pieces doffed), or abandoned (both earpieces doffed and both earpieces not being carried or worn on the body). In one example, the headset includes a motion detector such as an accelerometer to identify whether the headset is currently abandoned, such as when it has been placed on a table and indicates no motion.

The user has the ability to wear a binaural product in many ways, including around the neck or one side on the ear while the other side off (e.g. while driving), while still having the ability to hear music, hear an incoming call ringer, listen to both channels of a stereo signal through one ear, or otherwise use the product. For example, headset donned/doffed detection state information is used to determine the wearing mode of a body-worn communication device, and then switch or adjust audio settings (either receive audio or transmit audio), signal processing, audio paths, audio volumes, output transducers, ringer volumes or audio mixing for enhanced receive experience and improved safety. An electronic processor switches pre-determined audio mixing, source, digital signal processing, and/or transmit transducer selections based on the determined wearing mode.

These features advantageously allow a headset to be worn in a "stowage" wearing mode, e.g. around the neck or over the shoulder, or one ear on, one off, and still offer operational functionality and features specific to a particular wearing mode. Where the headset is abandoned or otherwise not worn on the body, select operational functionality may still be provided, such as an increased ringer volume output.

In one example, a headset system includes a first earbud system and a second earbud system. The first earbud system includes a first detector providing a first detector output indicating a first earbud donned condition or a first earbud doffed condition, and a first speaker. The second earbud system includes a second detector providing a second detector output indicating a second earbud donned condition or a second earbud doffed condition, and a second speaker. The headset further includes a microphone, a memory storing a headset controller application, and a processor for executing the headset controller application.

In one example, the headset controller application processes an audio signal for output to the user responsive to the first detector output and/or the second detector output. In a further example, the headset controller application activates or deactivates operation of the microphone, first speaker, or second speaker responsive to the first detector output and/or the second detector output. In yet another example, the headset controller application automates user interface actions responsive to the first detector output and/or the second detector output.

In one example, a method for headset operation includes providing a headset or headphone comprising a first earbud system and a second earbud system, and outputting a first detector output, the first detector output indicating a first earbud system donned condition or a first earbud system doffed condition. The method includes outputting a second detector output, the second detector output indicating a second earbud system donned condition or a second earbud system doffed condition.

In one example, the method further includes processing an audio signal responsive to the first detector output and/or the second detector output. In another example, the method further includes activating or deactivating operation of a headset or headphone component responsive to the first detector output and/or the second detector output. In a further example, the method further includes automating a user interface action responsive to the first detector output and/or the second detector output.

In one example, this description describes a method and apparatus for a headset system having a primary earbud for outputting a left channel audio signal into the wearer's first ear and a removable secondary earbud for outputting a right channel audio signal into the wearer's second ear. For example, the primary earbud may be integrated with a communications headset capable of making and receiving calls. The removable secondary earbud contains a don/doff detection mechanism which detects when the user is wearing the secondary earbud (donned) or not wearing the secondary earbud (doffed). Upon detection of a secondary earbud doffed state, the left and right channels are mixed together and output as a monaural signal at the primary earbud. Upon detection of a secondary earbud donned state, the left and right channels are delivered separately to the primary earbud and secondary earbud.

In a further example, a user controllable switch at the primary earbud is used to control the stereo or monaural output. With the switch in one position, the left channel of the content is delivered to one earbud and the right channel to the other. With the switch in a second position, the left and right channels are mixed together and delivered to only the primary earbud. The mixed channel may also be delivered to the secondary earbud, for instance, to share the music with another listener.

The herein described methods and systems provide several advantages over the prior art. For example, users can listen to music with one ear in the office environment or while in the midst of other activities and still gain a full listening experience.

In one example of the invention, a system includes a secondary earbud system and a primary earbud system. The secondary earbud system includes a detector providing an output indicating a secondary earbud donned condition or a secondary earbud doffed condition. The secondary earbud further includes a first speaker. The primary earbud system includes a memory storing an audio file output control application, a second speaker, and a processor for executing the audio file output control application. The audio file output control application outputs a monaural audio signal to the second speaker responsive to detection of the secondary earbud doffed condition, and outputs a stereo audio signal comprising a first channel and a second channel responsive to detection of the secondary earbud donned condition. The first channel is output to the first speaker and the second channel is output to the second speaker.

In one example of the invention, a method for listening to audio on a stereo headset includes providing a secondary earbud system and a primary earbud system. The method includes detecting kinetic energy, temperature or capacitance at the secondary earbud system to determine a secondary earbud system donned condition or a secondary earbud doffed condition. The method includes outputting a monaural audio signal to the primary earbud system responsive to determination of a secondary earbud system doffed condition. The method further includes outputting a stereo audio signal comprising a first channel and a second channel responsive to determination of a secondary earbud system donned condition, wherein the first channel is output to the primary earbud system and the second channel is output to the secondary earbud system.

In one example of the invention, a method for listening to audio on a stereo headset includes providing a secondary earbud system and a primary earbud system, and detecting a secondary earbud system donned condition or a secondary earbud doffed condition. The method includes outputting a monaural audio signal to the primary earbud system responsive to determination of a secondary earbud system doffed condition. The method further includes outputting a stereo audio signal having a first channel and a second channel responsive to determination of a secondary earbud system donned condition. The first channel is output to the primary earbud system and the second channel is output to the secondary earbud system.

In one example of the invention, a system includes a secondary earbud system having a first connector and a first speaker. A primary earbud system includes a second connector for removably coupling with the first connector, a memory storing an audio file output control application, and a second speaker. The primary earbud system further includes a processor for executing the audio file output control application, where the audio file output control application outputs a monaural audio signal to the second speaker responsive to detection of a de-coupled condition between the secondary earbud system and the primary earbud system. The audio file output control application outputs a stereo audio signal comprising a first channel and a second channel responsive to detection of a coupled condition between the secondary earbud system and the primary earbud system. The first channel is output to the first speaker and the second channel is output to the second speaker.

In one example of the invention, a method for listening to audio on a stereo headset or headphone includes providing a secondary earbud system and a primary earbud system, and detecting a coupled condition or a de-coupled condition between the secondary earbud system and the primary earbud system. The method further includes outputting a monaural audio signal to the primary earbud system responsive to detecting the de-coupled condition, and outputting a stereo audio signal having a first channel and a second channel responsive to determination of the coupled condition. The first channel is output to the primary earbud system and the second channel is output to the secondary earbud system.

In one example, this invention relates generally to headsets and headphones that automatically pause or resume playback of an audio signal or other multimedia based on whether the headset or headphones are donned or doffed. For example, playback of an audio signal is paused when a headset is doffed. Playback is resumed at the paused position when the headset is donned again. In one example, where a headset includes two earbuds, the source of the audio signal, such as a media player, may be paused when both earbuds are doffed. Alternatively, the source of the audio signal may be paused when only one of the two earbuds is doffed. Donning one or both earbuds results in a command to be sent to the media player to resume playing of the audio signal or media starting at the pause point. In this manner, users can more conveniently switch from listening to media to interacting with others around them without losing their place in the media. The media player may be located at one of the earbuds or separate from both earbuds. For example, where one of the earbuds is a telecommunications headset, the media player may be located in memory of the telecommunications headset. The means by which the earbuds communicate with the media player to initiate the pause or cause the media player to resume play from a paused state depends on the media player and how the earbuds interface to it. In one example where the earbuds and media player are hardwired, a separate command line can be used to interface the earbuds with the media player. For example, the iPod media player from Apple Computer allows for remote in-line controls. For wireless earbuds, the Bluetooth protocol allows for wireless control of the media player through the use of the Audio/Video Remote Control Profile (AVRCP).

In one example, a system includes a secondary earbud system and a primary earbud system. The secondary earbud system includes a first donned/doffed detector providing a first output indicating a secondary earbud donned condition or a secondary earbud doffed condition, and a first speaker. The primary earbud system includes a second donned/doffed detector providing a second output indicating a primary earbud donned condition or a primary earbud doffed condition, a memory storing an audio file output control application, and a second speaker. The primary earbud system further includes a processor for executing the audio file output control application. The audio file output control application outputs a monaural audio signal to the second speaker responsive to detection of a secondary earbud doffed condition and primary earbud donned condition. The audio file output control application pauses playback of an audio signal to the first speaker and the second speaker responsive to detection of both a secondary earbud doffed condition and primary earbud doffed condition.

In one example, a method for listening to audio on a stereo headset includes providing a secondary earbud system and a primary earbud system. The method includes detecting kinetic energy, temperature or capacitance at the secondary earbud system to determine a secondary earbud system donned condition or a secondary earbud doffed condition. The method includes detecting kinetic energy, temperature or capacitance at the primary earbud system to determine a primary earbud system donned condition or a primary earbud doffed condition. A monaural audio signal is output to the primary earbud system responsive to determination of a secondary earbud system doffed condition and primary earbud system donned condition. A stereo audio signal comprising a first channel and a second channel is output responsive to determination of both a secondary earbud system donned condition and primary earbud system donned condition, where the first channel is output to the primary earbud system and the second channel is output to the secondary earbud system. The method further includes pausing playback of an audio signal responsive to determination of a secondary earbud system doffed condition and a primary earbud system doffed condition.

In one example, a system includes a secondary earbud system and a primary earbud system. The secondary earbud system includes a first donned/doffed detector providing a first output indicating a secondary earbud donned condition or a secondary earbud doffed condition, and a first speaker. The primary earbud system includes a second donned/doffed detector providing a second output indicating a primary earbud donned condition or a primary earbud doffed condition, a memory storing an audio file output control application, and a second speaker. The primary earbud system further includes a processor for executing the audio file output control application, where the audio file output control application pauses playback of an audio signal to the first speaker and the second speaker responsive to detection of both a secondary earbud doffed condition and a primary earbud doffed condition.

In one example, a method for listening to audio on a stereo headset includes providing a secondary earbud system and a primary earbud system. The method includes detecting kinetic energy, temperature or capacitance at the secondary earbud system to determine a secondary earbud system donned condition or a secondary earbud doffed condition. The method includes detecting kinetic energy, temperature or capacitance at the primary earbud system to determine a primary earbud system donned condition or a primary earbud doffed condition. The method further includes pausing output of an audio signal responsive to determination of a secondary earbud system doffed condition and a primary earbud system doffed condition.

In one example, a system includes a secondary earbud system and a primary earbud system. The secondary earbud system includes a detector providing an output indicating a secondary earbud donned condition or a secondary earbud doffed condition and a first speaker. The primary earbud system includes a memory storing an audio file output control application and a second speaker. The primary earbud system further includes a processor for executing the audio file output control application. The audio file output control application outputs a stereo audio signal having a first channel and a second channel responsive to detection of a secondary earbud donned condition. The first channel is output to the first speaker and the second channel is output to the second speaker. The audio file output control application pauses output of the stereo audio signal responsive to detection of a secondary earbud doffed condition.

In one example, an audio system includes a first earbud system, a second earbud system, and a digital music player. The first earbud system includes a first donned/doffed detector providing a first output indicating a first earbud donned condition or a first earbud doffed condition, and a first speaker. The second earbud system includes a second donned/doffed detector providing a second output indicating a second earbud donned condition or a second earbud doffed condition, and a second speaker. The digital music player includes an audio file output control application. The audio file output control application pauses playback of an audio signal to the first speaker and the second speaker responsive to detection of a first earbud doffed condition and/or a second earbud doffed condition.

Figure 2:
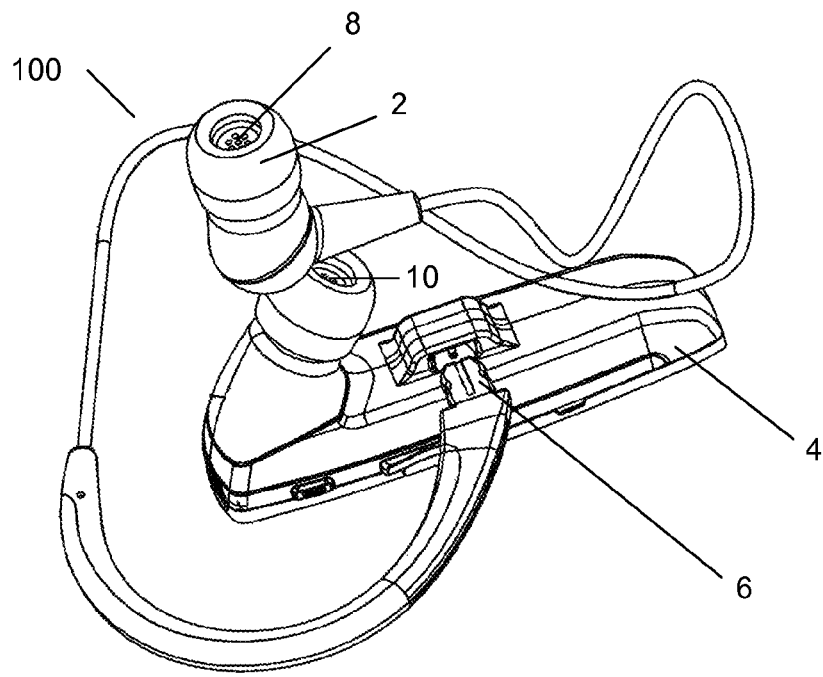
FIG. 2 shows a system including a headset and a detachable earbud in a decoupled state.

Referring now to FIG. 1, a headset system 100 includes a primary earbud in the form of a headset 4 and a secondary earbud 2 removably coupled together. Although the examples herein refer to the use of an earbud form factor, other form factors known in the art for outputting an audio signal to a user ear may be used. It should be noted that although the primary earbud is shown in the form of a telecommunications headset, the primary earbud need not have telecommunications capabilities. For example, the primary earbud and secondary earbud may be a stereo listening headphone having listen only functionality. Secondary earbud 2 includes a speaker 8 for outputting an audio signal to a wearer ear. Headset 4 includes a speaker 10 for outputting an audio signal to a wearer ear. FIG. 2 shows system 100 whereby the headset 4 and secondary earbud 2 are in a de-coupled state. As shown in FIG. 2, secondary earbud 2 includes a connector 6 for coupling and decoupling to the headset 4. In a further example, the primary earbud and secondary earbud are connected together in a non removable manner.

Figure 3:
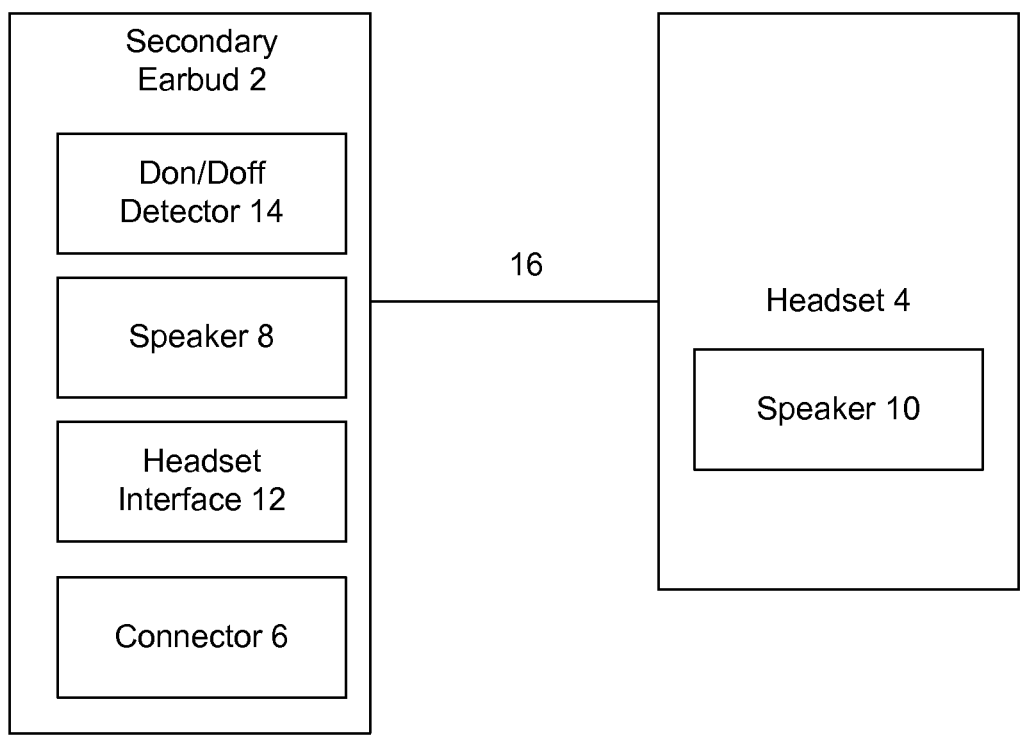
FIG. 3 shows a simplified block diagram of the earbud shown in FIGS. 1 and 2 having a don/doff detector for indicating a donned or doffed state.

FIG. 3 shows a simplified block diagram of the secondary earbud 2 shown in FIGS. 1 and 2 having a don/doff detector for indicating a donned or doffed state. Secondary earbud 2 includes a don/doff detector 14, speaker 8, connector 6, and headset interface 12 for communicating with headset 4. Headset 4 includes a speaker 10. Although in the example illustrated, secondary earbud 2 and headset 4 are removably coupled using a cable 16, in further examples secondary earbud 2 and headset 4 may communicate wirelessly using a wireless protocol such as Bluetooth or other protocol, or they may be permanently wired together.

FIGS. 5A through 5G show different examples, without limitation, of don/doff detector 14 (also referred to herein simply as "detector") used in the secondary earbud 2. As the user wears the secondary earbud 2, detector 14 transfers temperature and/or capacitance readings into an electromotive force, or an output charge. Current in this conductor is amplified electronically and processed. The output charges may be provided at predetermined or varying intervals and for predetermined or varying periods to form an output charge pattern. In one example, the output of detector 14 is digitized for processing.

Detector 14 may be a variety of detectors that provide output charges based upon an earbud characteristic such as temperature and/or capacitance. When an earbud is properly worn, several surfaces of the earbud touch or are in operable contact or close proximity with the user, herein referred to as "touch points" or "contact points". These touch/contact points can be monitored and used to determine the donned or doffed state of the earbud.

Figure 4:
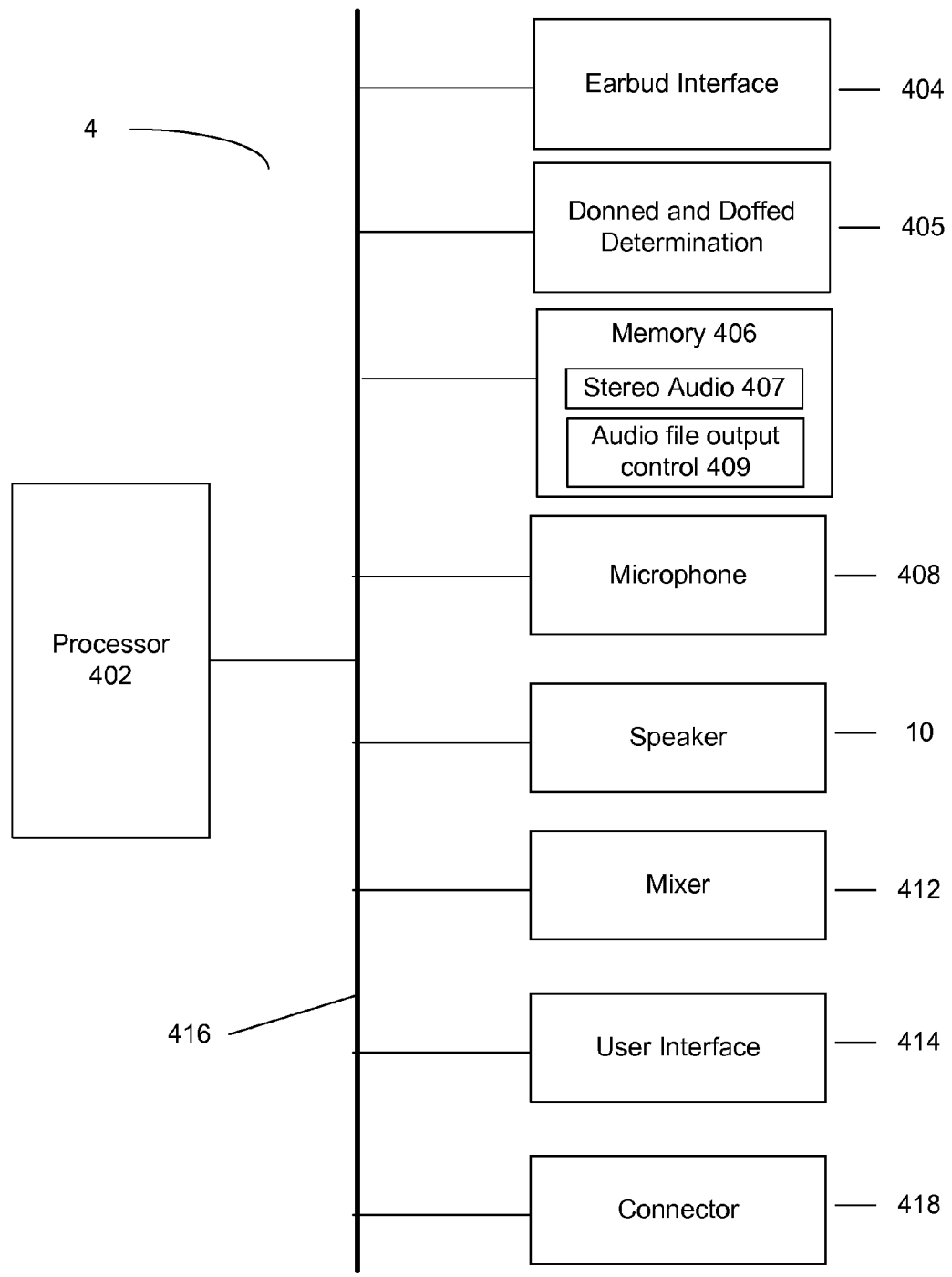
FIG. 4 shows a simplified block diagram of the headset shown in FIGS. 1 and 2 capable of outputting a stereo signal or monaural signal dependent on whether the earbud is donned or doffed.

Referring to FIGS. 3 and 4 together, in one example detector 14 is operably coupled to a donned and doffed determination circuit 405 (also referred to herein simply as "determination circuit") for determining whether a plurality of the output charges form an output charge pattern corresponding to a state selected from the group consisting of the headset being donned and doffed. In one example, determination circuit 405 compares the output charge pattern to a predetermined profile, and if the pattern is within the bounds of the predetermined profile, the headset is considered to be in a state of being donned. When there is no recognized output charge pattern for a predetermined period, then the headset may be considered to be in a state of being doffed.

In another embodiment, the output charge pattern may be recognized as a doffed output charge pattern. The output charges may be shaped using a comparator circuit which is connected to an input pin on a general purpose microcontroller. In this example, determination circuit 405 is an individual component operably coupled to other components of headset 4 via bus 416, but determination circuit 405 may be placed in various places, for example being integrated with processor 402 or detector 14, stored in memory 406, or being provided from outside of headset 4, for example at earbud 2. In a further example, determination circuit 405 is implemented as a donned and doffed determination software module residing in memory 406. The donned and doffed determination software module processes a digitized detector output signal to identify the donned or doffed status.

Figure 5A:
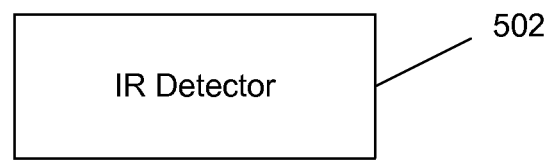
FIGS. 5A through 5G show different examples of don/doff detectors used in an earbud or headset.

FIG. 5A illustrates an infra-red (IR) detector 502 that is sensitive to the temperature of a human body. Humans having a skin temperature of about 93 degrees Fahrenheit, radiate infra-red energy with a wavelength between about 9 and 10 micrometers. Therefore, the IR detector may be configured to be sensitive in the range of 8 to 12 micrometers, and may be positioned to aim at a point where the earbud is intended to contact a user's skin, such as the user's skin or hair. When the earbud user dons the earbud, the IR detector 502 detects radiation in the wavelengths between 9 and 10 micrometers and provides an electrical signal or output charge that is amplified, sent to a donned and doffed determination circuit, and processed as described above to determine a state of the earbud.

Figure 5B:
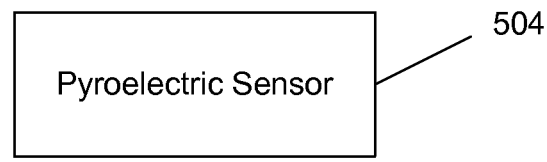

FIG. 5B illustrates a pyroelectric sensor 504 that is positioned in close proximity to a point where the earbud is intended to contact a user's skin. The sensor detects a user is present by determining a skin temperature near 93 degrees Fahrenheit and then providing an electrical signal or output charge that is amplified, sent to a donned and doffed determination circuit, and processed as described above to determine a state of the earbud. In a further example, two pyroelectric sensors may be used, with one sensor positioned close to a contact point and the other positioned in a location away from a contact point. Differences (a delta) between the readings of the two sensors can be used to determine a donned or doffed state of the earbud, for example if the delta of the two temperature readings is at or above a predetermined level.

Figure 5C:
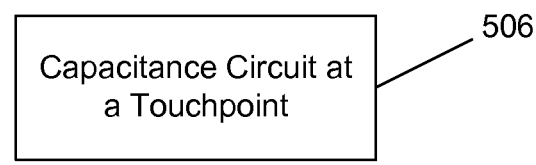

FIG. 5C illustrates a capacitance circuit 506 sensitive to capacitance positioned in close proximity to a point where the earbud is intended to contact a user's skin. The circuit detects an increase in capacitance when the earbud is worn and provides an output charge that is amplified, sent to a donned and doffed determination circuit, and processed as described above to determine a state of the earbud.

Figure 5D:
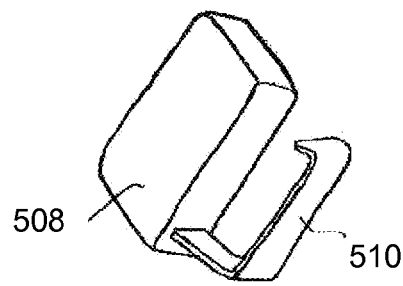

Other detectors that may be used at a touch point include micro-switches, as shown in FIG. 5D. A micro-switch 508 can be housed and operably coupled to a PCBA within the earbud device such that an actuator 510 of the switch is positioned at a touch point of the earbud, thereby being depressed when the earbud is worn. A determination circuit in either the PCBA or at the headset 2 can monitor the state of the switch, thereby determining the state of the earbud.

Figure 5E:
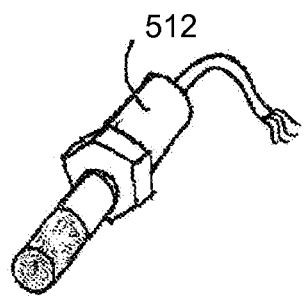

Another detector that may be used includes an inductive proximity sensor 512, as shown in FIG. 5E. A proximity switch 512 can be housed and operably coupled to a PCBA within the earbud device such that the switch 512 is positioned at a touch point of the earbud, thereby being triggered or activated when the earbud is worn. This use of a proximity switch does not require force from the user's skin, but proximity to the user (without consistent force) such that a change in magnetic field is detected is sufficient to trigger the sensor. A determination circuit at the headset 2 or earbud PCBA can monitor the state of the switch, discriminating between a donned or doffed state of the earbud.

Figure 5F:
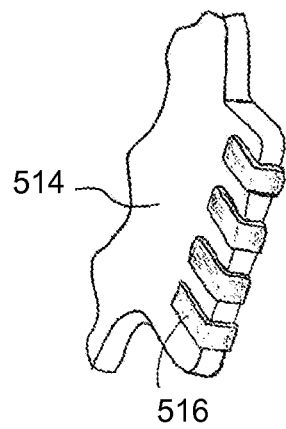

Yet another detector that may be used includes a skin resistivity sensor 514, as shown in FIG. 5F. Conductive materials 516 can be used at two or more touch points on the earbud, and a circuit at the headset or the earbud PCBA can monitor the resistance between these conductive materials, thereby detecting a resistance that is consistent with a predetermined range, thus discriminating between a donned and a doffed state of the earbud. That is, when the two or more contact points are in contact with the user's skin, the resistance reading between these contact points will be different from when the earbud is not worn, for example the resistance being reduced when the earbud is worn due to the skin adding conductance to the circuit.

Figure 5G:
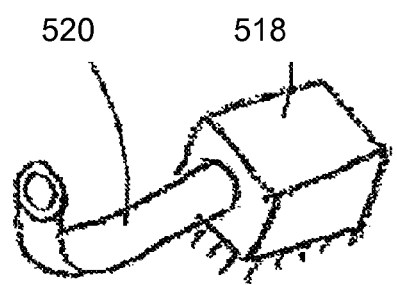

In addition to donned or doffed detectors utilizing surface contact with the user skin (referred to herein as a "touch point") to determine a donned or doffed state, donned or doffed detectors not requiring a touch point may be used. Referring now to FIG. 5G, another detector that may be utilized includes a carbon dioxide ($CO_2$) sensor 518 operably coupled to a PCBA and a channel 520 in accordance with an embodiment. Sensor 518 is able to detect an increase of $CO_2$, thereby inferring a donned state of an earbud. In one embodiment, sensor 518 is able to subtract background $CO_2$ levels to more accurately discriminate between donned and doffed states, and in another embodiment, sensor 518 and a determination circuit are able to detect patterns of $CO_2$ levels correlating to human breathing patterns.

In a further example, acoustic seal detection is utilized to determine the donned or doffed state without the use of a touch point. The headset wearing mode is determined by monitoring the pressure within the acoustic chamber to determine if the acoustic path is relatively free or if there is obstruction due to being placed on or about the ear. In one example, the impedance of the speaker is monitored, which varies dependent on whether the speaker is driving into a free field, corresponding to a doffed state, or whether the speaker is coupled to the ear, corresponding to a donned state.

It is noted that a variety of detectors that provide an output charge pattern corresponding to a donned or doffed state of an earbud are within the scope of the present invention. In a further example of the invention, a variety of motion detectors may be used. Further discussion regarding the use of sensors or detectors and determination circuits to detect a donned or doffed state can be found in the commonly assigned and co-pending U.S. patent application Ser. No. 11/542,385 entitled "Donned and Doffed Headset State Detection", which was filed on Oct. 2, 2006, and which is hereby incorporated into this disclosure by reference for all purposes.

In further examples, two or more of the embodiments described above may be used in one earbud in order to determine a donned or doffed earbud state with greater accuracy and reliability. For example, in one case with one motion detector and one non-motion detector being used, an earbud state can be indicated when both detectors indicate the same state.

FIG. 4 shows a simplified block diagram of the headset 4 shown in FIGS. 1 and 2 capable of outputting a stereo signal or monaural signal dependent on whether the earbud is donned or doffed. Referring to FIG. 1 and FIG. 4, headset 4 includes a processor 402 operably coupled via a bus 416 to an earbud interface 404, donned and doffed determination circuit 405, memory 406, microphone 408, speaker 10, mixer 412, connector 418, and user interface 414. Connector 418 removably couples headset 4 to secondary earbud connector 6. Stereo audio 407 may be stored in memory 406 for playback by processor 402. An audio file output control application 409 also resides in memory 406. Audio file output control application 409 is executed by processor 402 and interfaces with mixer 412 to output either a monaural signal to speaker 10 or separate audio channels to speaker 10 and earbud speaker 8. In one example, stereo audio 407 is received from a digital file player residing at a device separate from headset 4. For example, the digital file player may be a digital music player residing on a telephone or personal computer. In a further example, the digital music player may reside on headset 4 itself as a software implemented player or as a dedicated chip. In a further example, donned and doffed determination circuit 405 is located at earbud 2 rather than headset 4.

Processor 402 allows for processing data, in particular managing data between earbud interface 404, audio file output control application 409, donned and doffed determination circuit 405, memory 406, mixer 412, and speaker 10. In one example, donned and doffed determination circuit 405 receives an output signal from the donned and doffed detector 14 at secondary earbud 2 and determines the donned or doffed state of secondary earbud 2. In a further example, secondary earbud 2 includes a donned and doffed determination module which processes the output from donned and doffed detector 14 to determine the donned or doffed state of secondary earbud 2. In this further example, the donned or doffed state of secondary earbud 2 is sent to headset 4.

Stereo audio 407 includes a first channel and a second channel. For example, the first channel may be designed for the user's left ear and the second channel may be designated for the user's right ear. It should be noted that these designations may be reversed. If secondary earbud 2 is in a donned state, processor 402 outputs the stereo audio signal 407 first channel to the secondary earbud 2 for output by speaker 8 and outputs the second channel at the headset 4 for output by speaker 10 or vice versa, depending on wearing preference. If secondary earbud 2 is in a doffed state, processor 402 combines the first channel and second channel into a single monaural channel with mixer 412, whereby the single monaural channel is output at the headset 4 at speaker 10. Mixing can either be done by the processor in the digital domain or an analog mixer can be used to mix the audio signals.

In one example, processor 402 is a high performance, highly integrated, and highly flexible system-on-chip (SOC), including signal processing functionality such as echo cancellation/reduction and gain control. Processor 402 may include a variety of processors (e.g., digital signal processors), with conventional CPUs being applicable.

Memory 406 may include a variety of memories, and in one example includes SDRM, ROM, flash memory, or a combination thereof. Memory 406 may further include separate memory structures or a single integrated memory structure. In one example, memory 406 may be used to store passwords, network and telecommunications programs, and/or an operating system (OS). In one embodiment, memory 406 may store donned and doffed determination circuit 405, output charges and patterns thereof from secondary earbud detector 14, and predetermined output charge profiles for comparison to determine the donned and doffed state of secondary earbud 2.

User interface 414 allows for manual communication between the headset user and the headset, and in one example includes an audio and/or visual interface such that a prompt may be provided to the user's ear and/or an LED may be lit. User interface 814 may include buttons, switches, or touch sensors to receive call answer, power on/off, menu navigation, or multimedia output control user input actions and user preferences.

Figure 6:
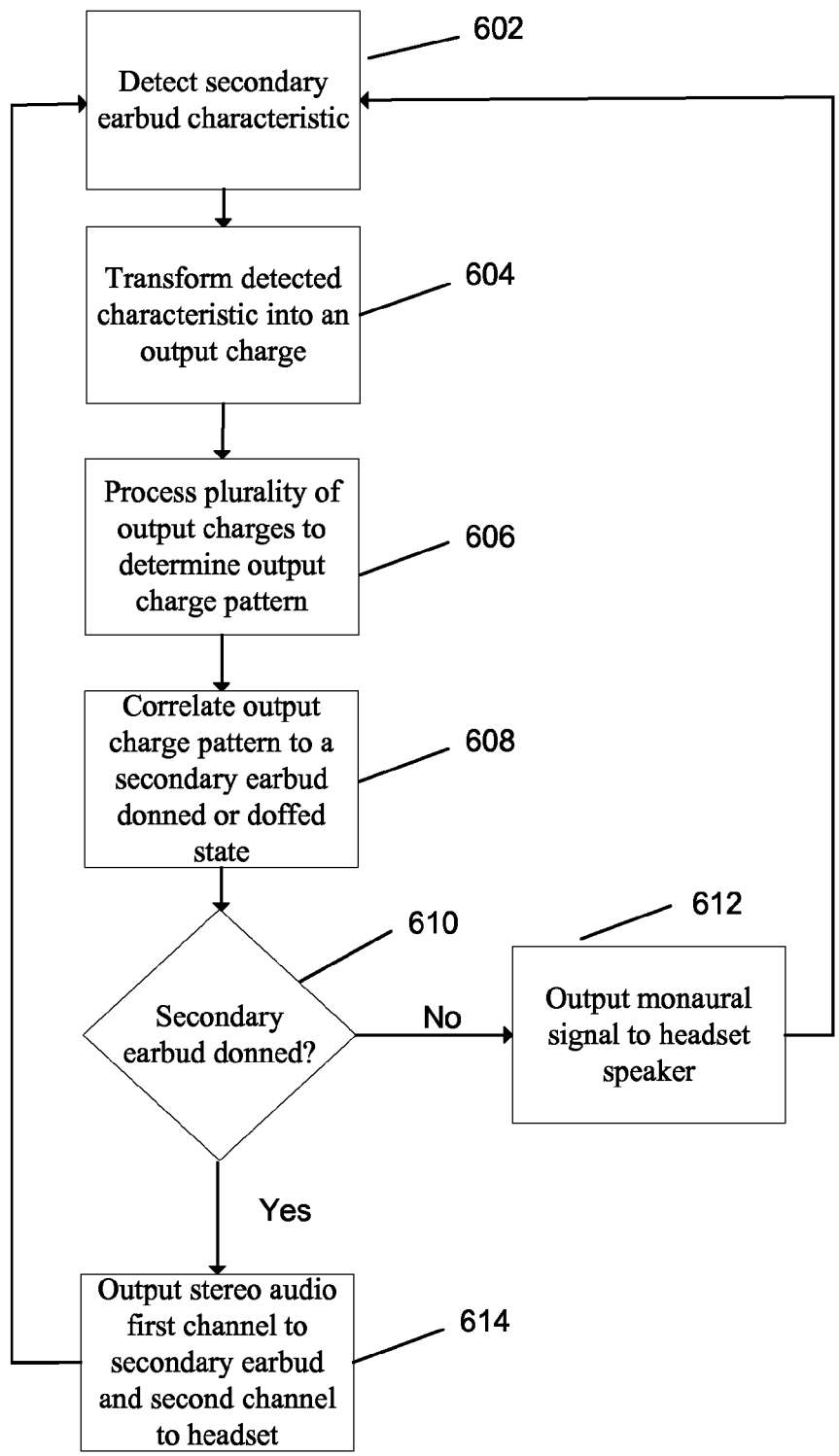
FIG. 6 is a flowchart showing a method of outputting a stereo or monaural signal based upon a donned or doffed state of the earbud.

FIG. 6 is a flowchart showing a method of outputting a stereo or monaural signal based upon a donned or doffed state of the earbud in one example. At block 602, a secondary earbud characteristic, such as kinetic energy, temperature, and/or capacitance, is detected by a detector. At block 604, the detector provides an output charge corresponding to a detected characteristic. The output charge is amplified and transferred to a donned and doffed determination circuit. At block 606, a plurality of output charges are processed by the determination circuit to determine an output charge pattern. At block 608, the determination circuit correlates the output charge pattern to a donned or doffed state of the secondary earbud, in one example comparing the output charge pattern to predetermined output charge profiles that reflect a donned or doffed state of a secondary earbud. The predetermined output charge profiles may be in look-up tables or a database and may include a variety of parameters, such as for particular headsets and headphones and detectors being used. At decision block 610, it is determined whether the secondary earbud is donned. If no at decision block 610, a monaural signal is output to the headset speaker at block 612. If yes at decision block 610, at block 614 a stereo audio first channel is output to a secondary earbud speaker and a stereo audio second channel is output to a headset speaker. The process then returns to block 602.

In a further example, the connection state between secondary earbud 2 and primary earbud 4 is used to control the stereo or monaural output. A coupled state is detected when connector 6 of secondary earbud 2 is connected to connector 418 of primary earbud 4. For example, pins on a multi-pin connector could be used to detect the connected state by closing an electrical circuit when connected. Upon detection of a coupled state between secondary earbud 2 and primary earbud 4, the left and right channels are delivered separately to the primary earbud and secondary earbud. Upon detection of a de-coupled state between secondary earbud 2 and primary earbud 4, the left and right channels are mixed together and output as a monaural signal at the primary earbud.

Figure 7:
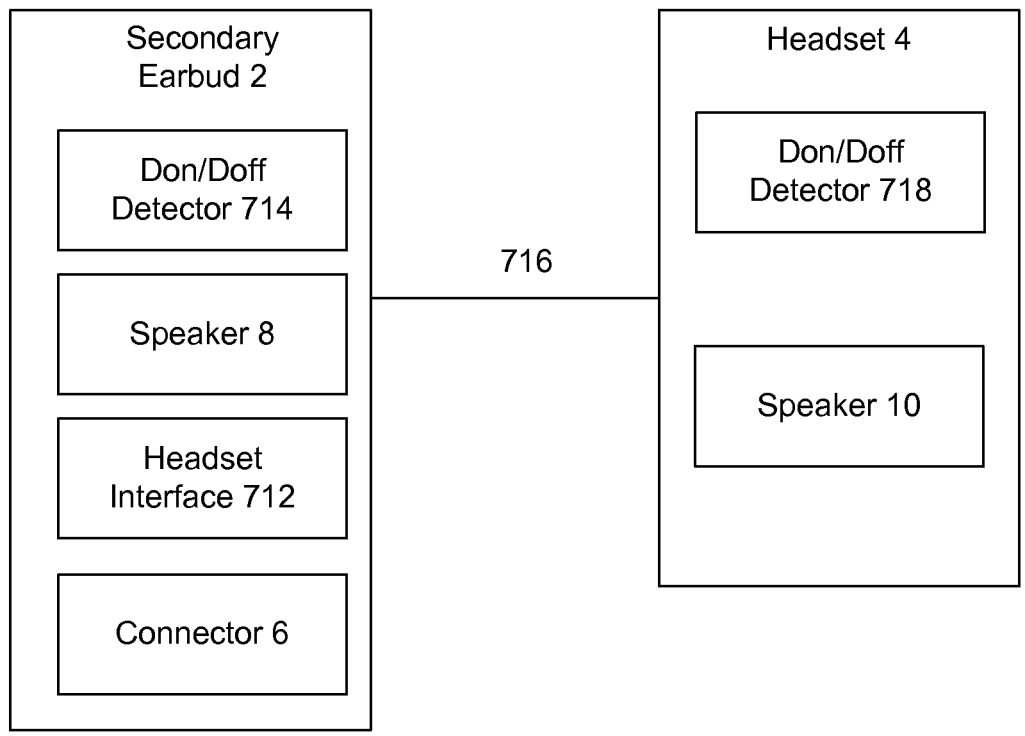
FIG. 7 shows a simplified block diagram of the earbud and headset shown in FIGS. 1 and 2 in a further example, each having a don/doff detector for indicating a donned or doffed state.

FIG. 7 shows a simplified block diagram of the earbud and headset shown in FIGS. 1 and 2 in a further example. In this example, both secondary earbud 2 and headset 4 have a don/doff detector for indicating a donned or doffed state. Secondary earbud 2 includes a don/doff detector 714, speaker 8, connector 6, and headset interface 712 for communicating with headset 4. Headset 4 includes a don/doff detector 718 and speaker 10. Although in the example illustrated, secondary earbud 2 and headset 4 are removably coupled using a cable 716, in further examples secondary earbud 2 and headset 4 may communicate wirelessly using a wireless protocol such as Bluetooth or other protocol, or they may be permanently wired together.

Figure 8:
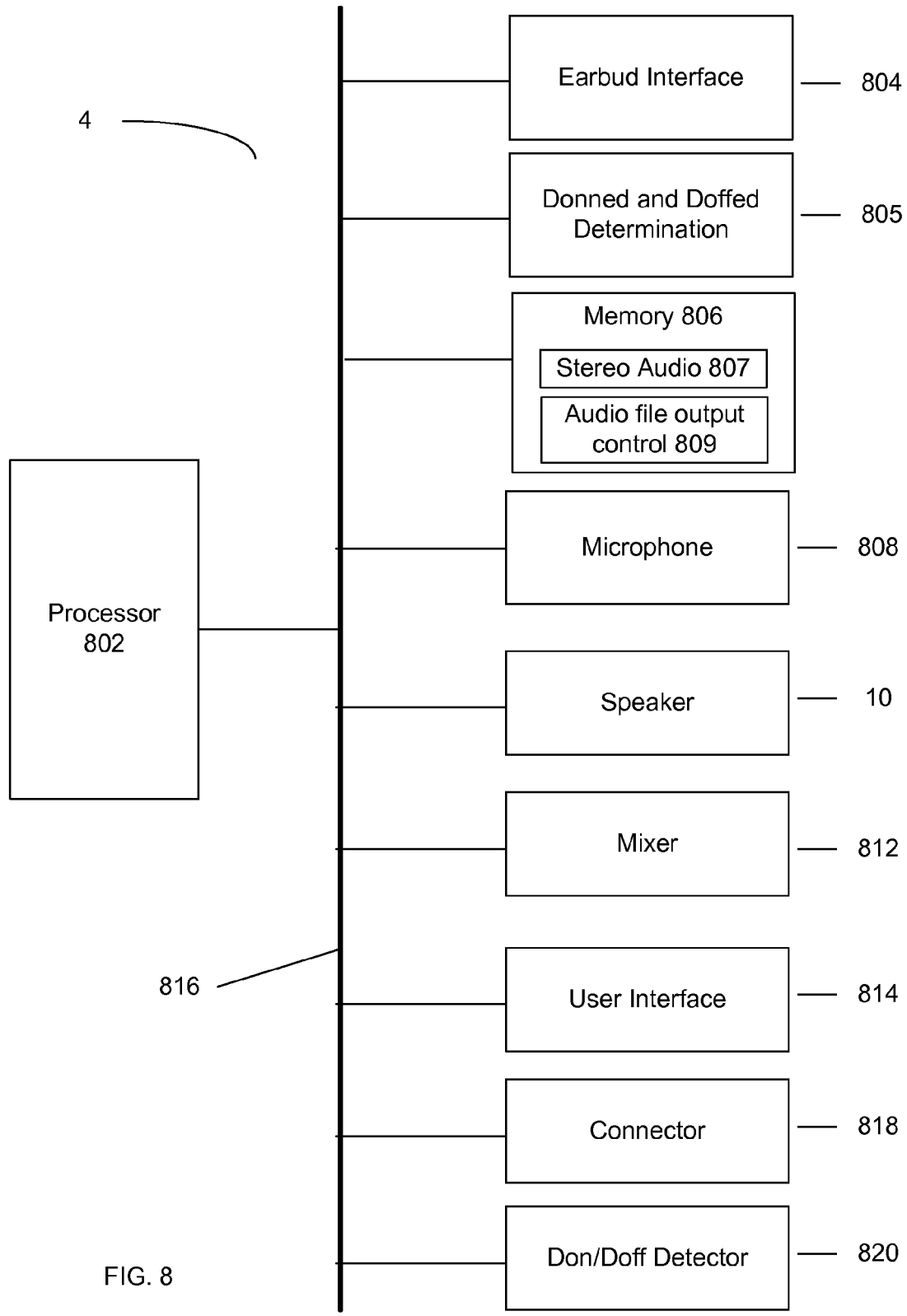
FIG. 8 shows a simplified block diagram of the headset shown in FIG. 7 in a further example.

FIG. 8 shows a simplified block diagram of the headset shown in FIG. 7 in a further example where the headset 4 is capable of pausing playback of an audio file, resuming playback of an audio file, or outputting a stereo signal or monaural signal dependent on whether the earbud 2 and headset 4 are donned or doffed. Headset 4 includes a processor 802 operably coupled via a bus 816 to an earbud interface 804, donned and doffed determination circuit 805, memory 806, microphone 808, speaker 10, mixer 812, connector 818, don/doff detector 820, and user interface 814. Connector 818 removably couples headset 4 to secondary earbud connector 6. Stereo audio signal 807 may be stored in memory 806 for playback by processor 802. An audio file output control application 809 also resides in memory 806. Audio file output control application 809 is executed by processor 802 and interfaces with mixer 812 to output either a monaural signal to speaker 10 or separate audio channels to speaker 10 and earbud speaker 8. Depending on the particular chosen implementation, mixer 812 may be optional. In one example, stereo audio signal 807 is received from a digital file player residing at a device separate from headset 4. For example, the digital file player may be a digital music player residing on a telephone or personal computer. In a further example, the digital music player may reside on headset 4 itself as a software implemented player or as a dedicated chip.

Processor 802 allows for processing data, in particular managing data between earbud interface 804, audio file output control application 809, donned and doffed determination circuit 805, memory 806, mixer 812, and speaker 10. In one example, donned and doffed determination circuit 805 receives an output signal from the donned and doffed detector 14 at secondary earbud 2 and determines the donned or doffed state of secondary earbud 2. In a further example, secondary earbud 2 includes a donned and doffed determination module which processes the output from donned and doffed detector 14 to determine the donned or doffed state of secondary earbud 2. In this further example, the donned or doffed state of secondary earbud 2 is sent to headset 4. Donned and doffed determination circuit 805 also receives an output signal from the don/doff detector 820 at headset 4 and determines the donned or doffed state of headset 4. The donned or doffed condition of secondary earbud 2 and headset 4 are periodically updated so that the current state or any change in state is detected.

Stereo audio signal 807 includes a first channel and a second channel. For example, the first channel may be designed for the user's left ear and the second channel may be designated for the user's right ear. It should be noted that these designations may be reversed. Processor 802 executing audio file output control application 809 controls playback of stereo audio signal 807. For example, processor 802 pauses playback depending on the donned or doffed state of earbud 2 and/or headset 4. Processor 802 may resume playback of an audio file at the point where playback was paused depending on the donned or doffed state of earbud 2 and/or headset 4. The particular combinations of usage states of secondary earbud 2 and headset 4 resulting in playback pause may be varied as desired.

In one example during audio playback, if secondary earbud 2 is in a donned state, processor 802 outputs the stereo audio signal 807 first channel to the secondary earbud 2 for output by speaker 8 and outputs the second channel at the headset 4 for output by speaker 10. During audio playback, if it is detected that secondary earbud 2 is in a doffed state, processor 802 pauses playback of stereo audio signal 807 to both the secondary earbud 2 and headset 4. Alternatively, the audio playback is similarly controlled based on the donned or doffed state of headset 4.

In a further example during audio playback, if secondary earbud 2 and headset 4 are both in a doffed state, processor 802 pauses playback of stereo audio signal 807. Upon detection that both secondary earbud 2 and headset 4 enter a donned state, playback of stereo audio signal 807 is resumed.

In a further example during audio playback, if it is detected that headset 4 is not donned, processor 802 pauses playback of stereo audio signal 807. If it is detected that headset 4 is donned and secondary earbud 2 is doffed, processor 802 outputs a monaural signal to the headset speaker. If it is detected that both headset 4 is donned and secondary earbud 2 is donned, processor 802 resumes playback from a paused state and outputs the stereo audio signal 807 first channel to the secondary earbud speaker and outputs the stereo audio signal 807 second channel to the headset speaker.

In one example, processor 802 is a high performance, highly integrated, and highly flexible system-on-chip (SOC) including signal processing functionality such as echo cancellation/reduction and gain control. Processor 802 may include a variety of processors (e.g., digital signal processors), with conventional CPUs being applicable.

Memory 806 may include a variety of memories, and in one example includes SDRM, ROM, flash memory, or a combination thereof. Memory 806 may further include separate memory structures or a single integrated memory structure. In one example, memory 806 may be used to store passwords, network and telecommunications programs, and/or an operating system (OS). In one embodiment, memory 806 may store donned and doffed determination circuit 805, output charges and patterns thereof from secondary earbud detector 714 and headset don/doff detector 820, and predetermined output charge profiles for comparison to determine the donned and doffed state of secondary earbud 2 and headset 4. User interface 814 allows for manual communication between the headset user and the headset, and in one example includes an audio and/or visual interface such that a prompt may be provided to the user's ear and/or an LED may be lit.

Figure 9:
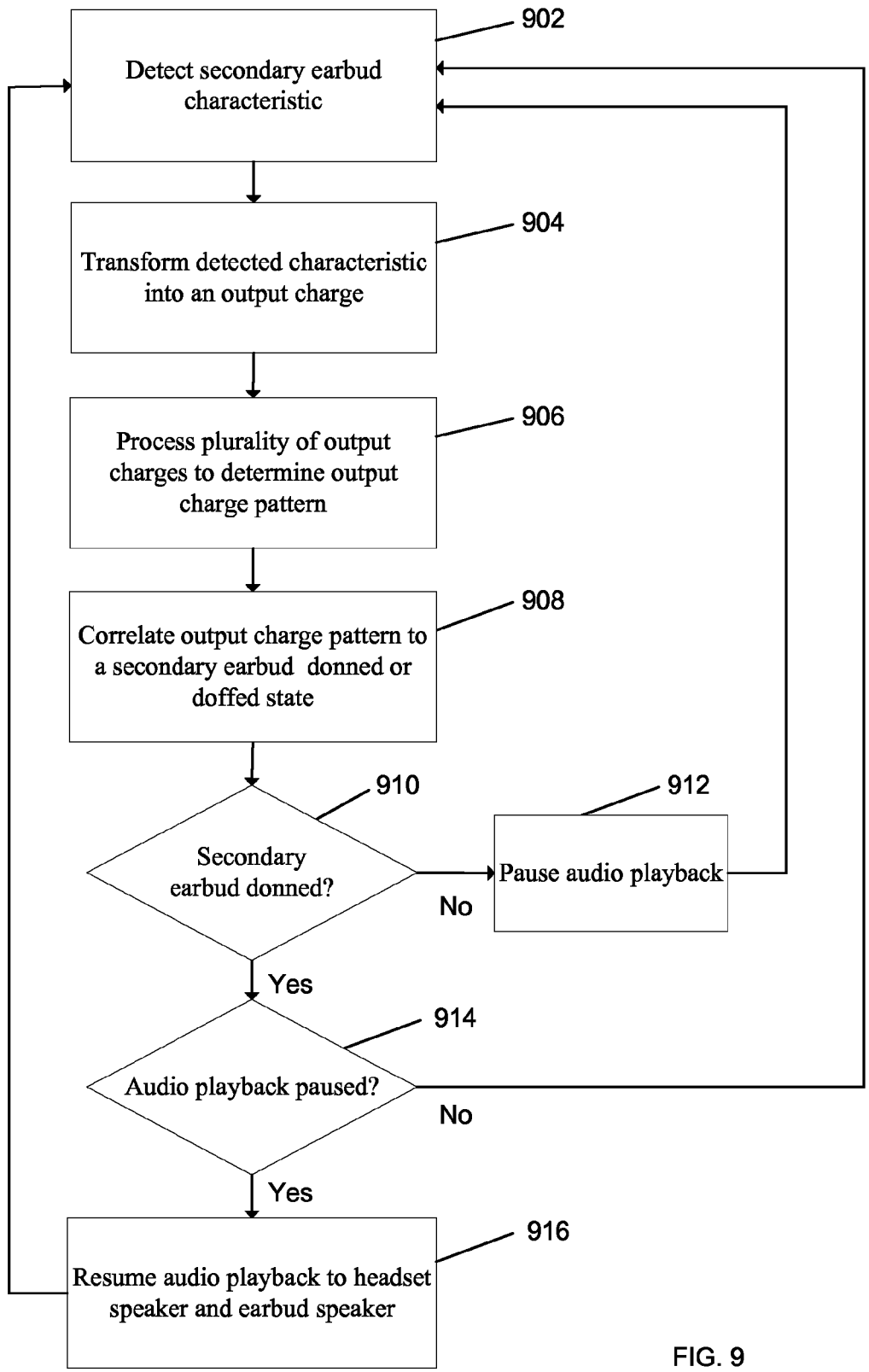
FIG. 9 is a flowchart showing a method of controlling playback of an audio file based upon a donned or doffed state of an earbud in a further example.

FIG. 9 is a flowchart showing a method of controlling playback of an audio file based upon a donned or doffed state of an earbud in one example. At block 902, a secondary earbud characteristic, such as kinetic energy, temperature, and/or capacitance, is detected by a detector. At block 904, the detector provides an output charge corresponding to a detected characteristic. The output charge is amplified and transferred to a donned and doffed determination circuit. At block 906, a plurality of output charges are processed by the determination circuit to determine an output charge pattern. At block 908, the determination circuit correlates the output charge pattern to a donned or doffed state of the secondary earbud, in one example comparing the output charge pattern to predetermined output charge profiles that reflect a donned or doffed state of a secondary earbud. The predetermined output charge profiles may be in look-up tables or a database and may include a variety of parameters, such as for particular headsets and headphones and detectors being used. At decision block 910, it is determined whether the secondary earbud is donned. If no at decision block 910, playback of audio is paused. If yes at decision block 910, at decision block 914 it is determined whether audio playback is currently paused. If no at decision block 914, then the process returns to block 902. If yes at decision block 914, then at block 916 audio playback to the headset speaker and earbud speaker is resumed. The process then returns to block 902.

Figure 10A:
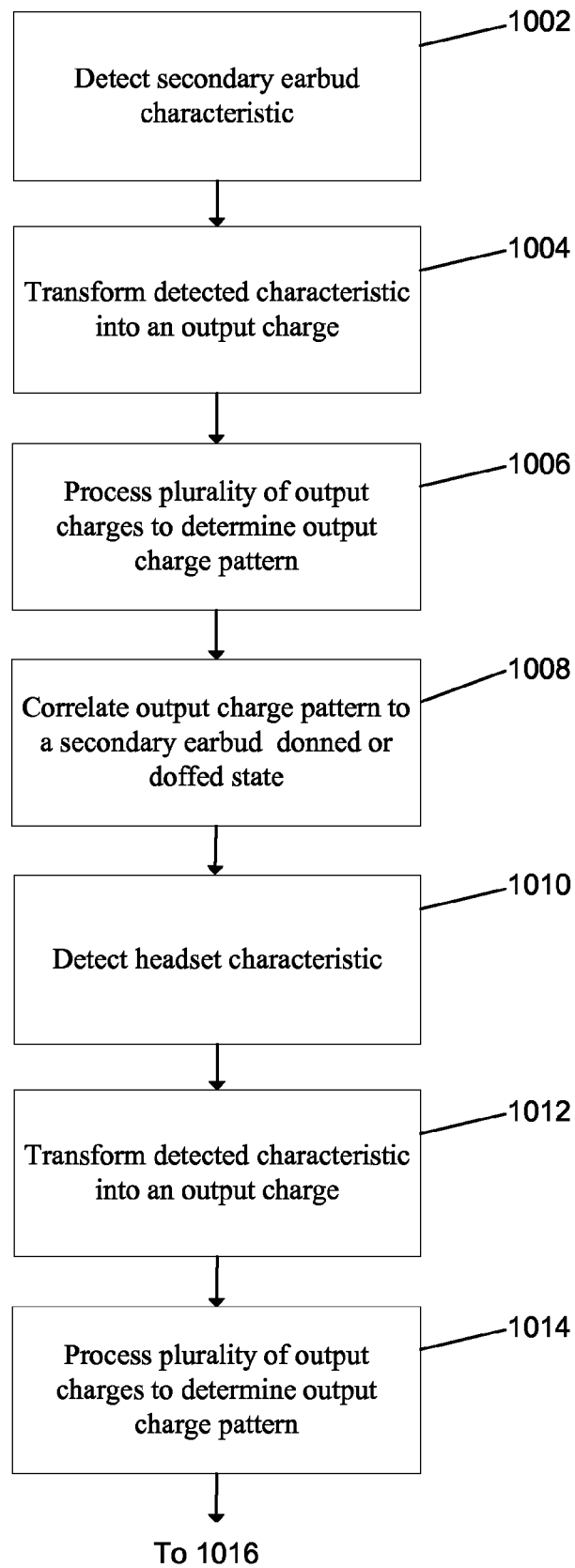
FIGS. 10A and 10B are a flowchart showing a method of controlling playback of an audio file based upon a donned or doffed state of both an earbud and a headset in a further example.
Figure 10B:
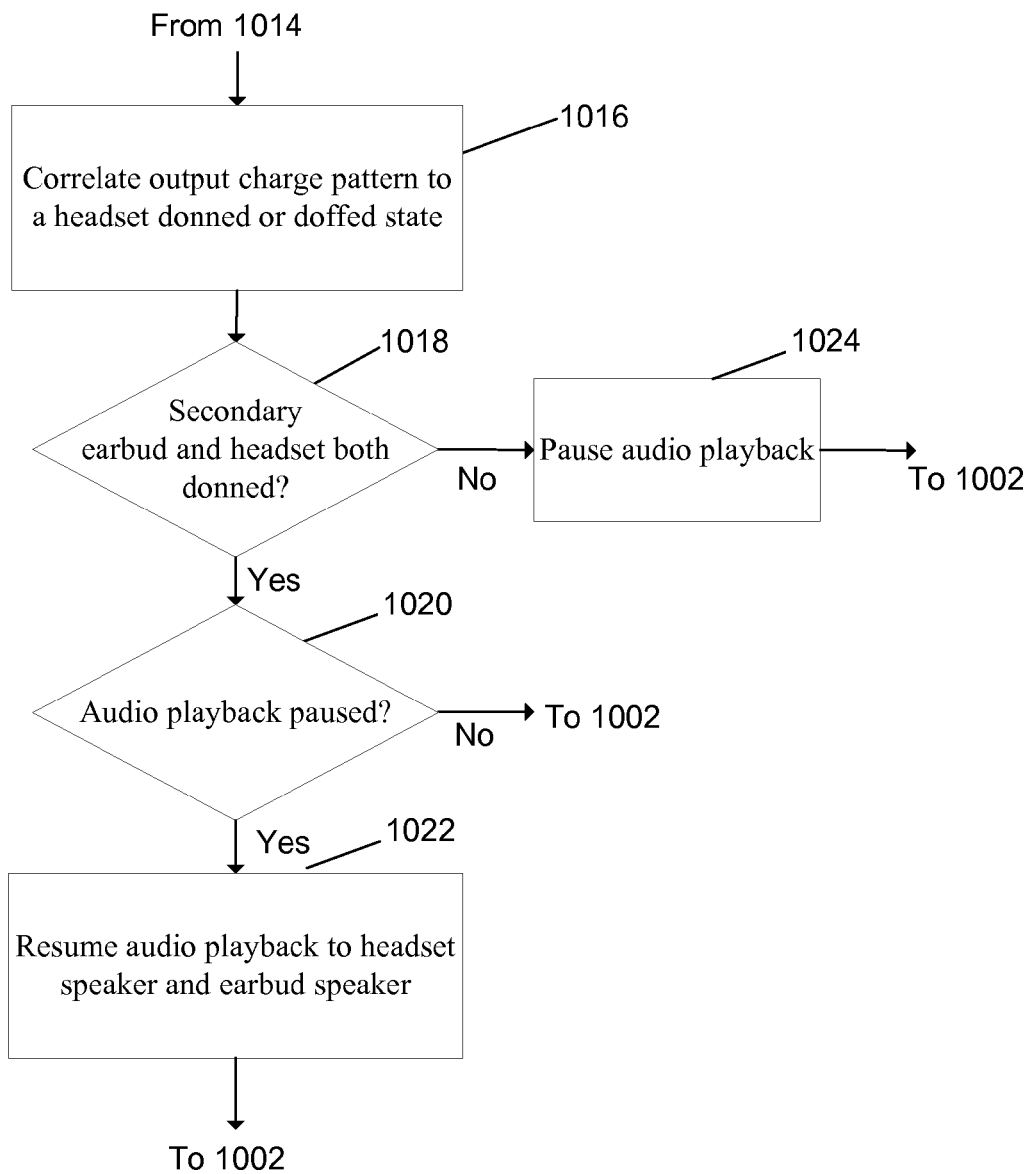

FIGS. 10A and 10B are a flowchart showing a method of controlling playback of an audio file based upon a donned or doffed state of both an earbud and a headset in a further example. At block 1002, a secondary earbud characteristic, such as kinetic energy, temperature, and/or capacitance, is detected by a detector. At block 1004, the detector provides an output charge corresponding to a detected characteristic. The output charge is amplified and transferred to a donned and doffed determination circuit. At block 1006, a plurality of output charges are processed by the determination circuit to determine an output charge pattern. At block 1008, the determination circuit correlates the output charge pattern to a donned or doffed state of the secondary earbud, in one example comparing the output charge pattern to predetermined output charge profiles that reflect a donned or doffed state of a secondary earbud. The predetermined output charge profiles may be in look-up tables or a database and may include a variety of parameters, such as for particular headsets and headphones and detectors being used.

At block 1010, a headset characteristic, such as kinetic energy, temperature, and/or capacitance, is detected by a detector. At block 1012, the detector provides an output charge corresponding to a detected characteristic. The output charge is amplified and transferred to a donned and doffed determination circuit. At block 1014, a plurality of output charges are processed by the determination circuit to determine an output charge pattern. At block 1016, the determination circuit correlates the output charge pattern to a donned or doffed state of the headset, in one example comparing the output charge pattern to predetermined output charge profiles that reflect a donned or doffed state of a headset. Although determining the donned or doffed state of the headset is illustrated after determining the donned or doffed state of the secondary earbud, blocks 1010 to 1016 may occur simultaneously with blocks 1002 to 1008.

At decision block 1018, it is determined whether both the secondary earbud and the headset are donned. If no at decision block 1018, playback of audio is paused and the process returns to block 1002. If yes at decision block 1018, at decision block 1020 it is determined whether audio playback is currently paused. If no at decision block 1020, then the process returns to block 1002. If yes at decision block 1020, then at block 1022 audio playback to the headset speaker and earbud speaker is resumed. The process then returns to block 1002.

Figure 11A:
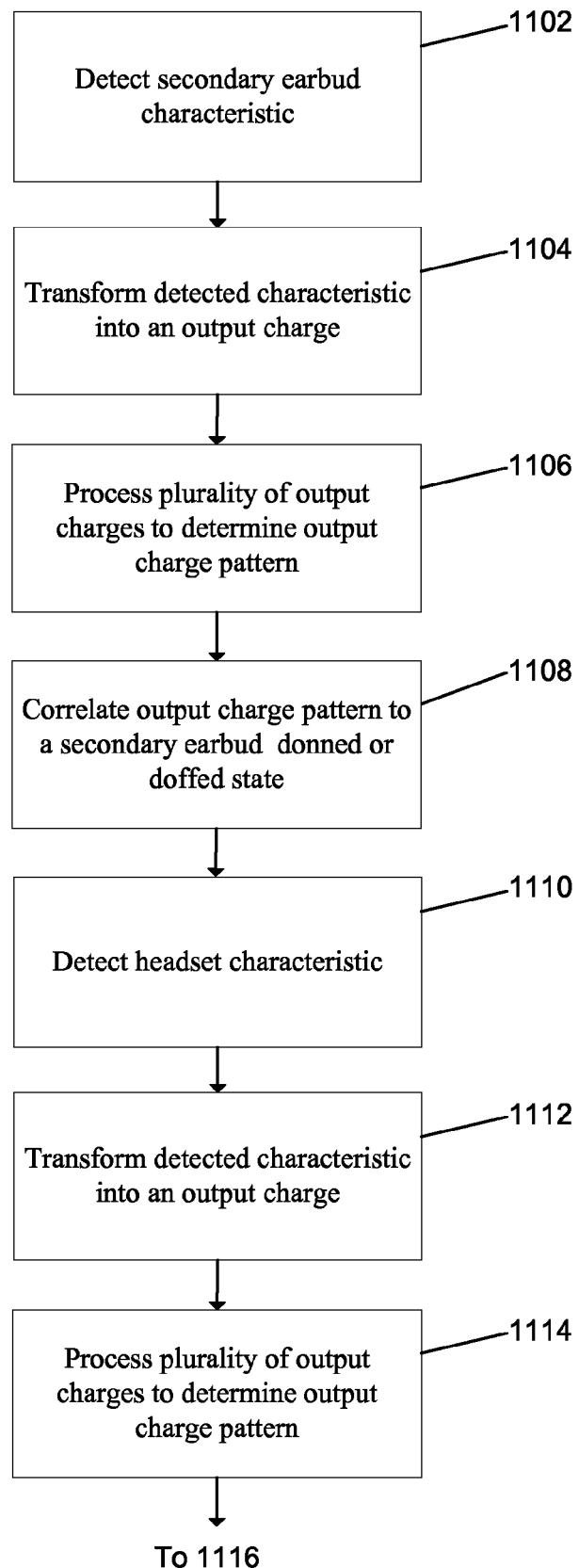
FIGS. 11A and 11B are a flowchart showing a method of controlling playback of an audio file based upon a donned or doffed state of both an earbud and a headset in a further example.
Figure 11B:
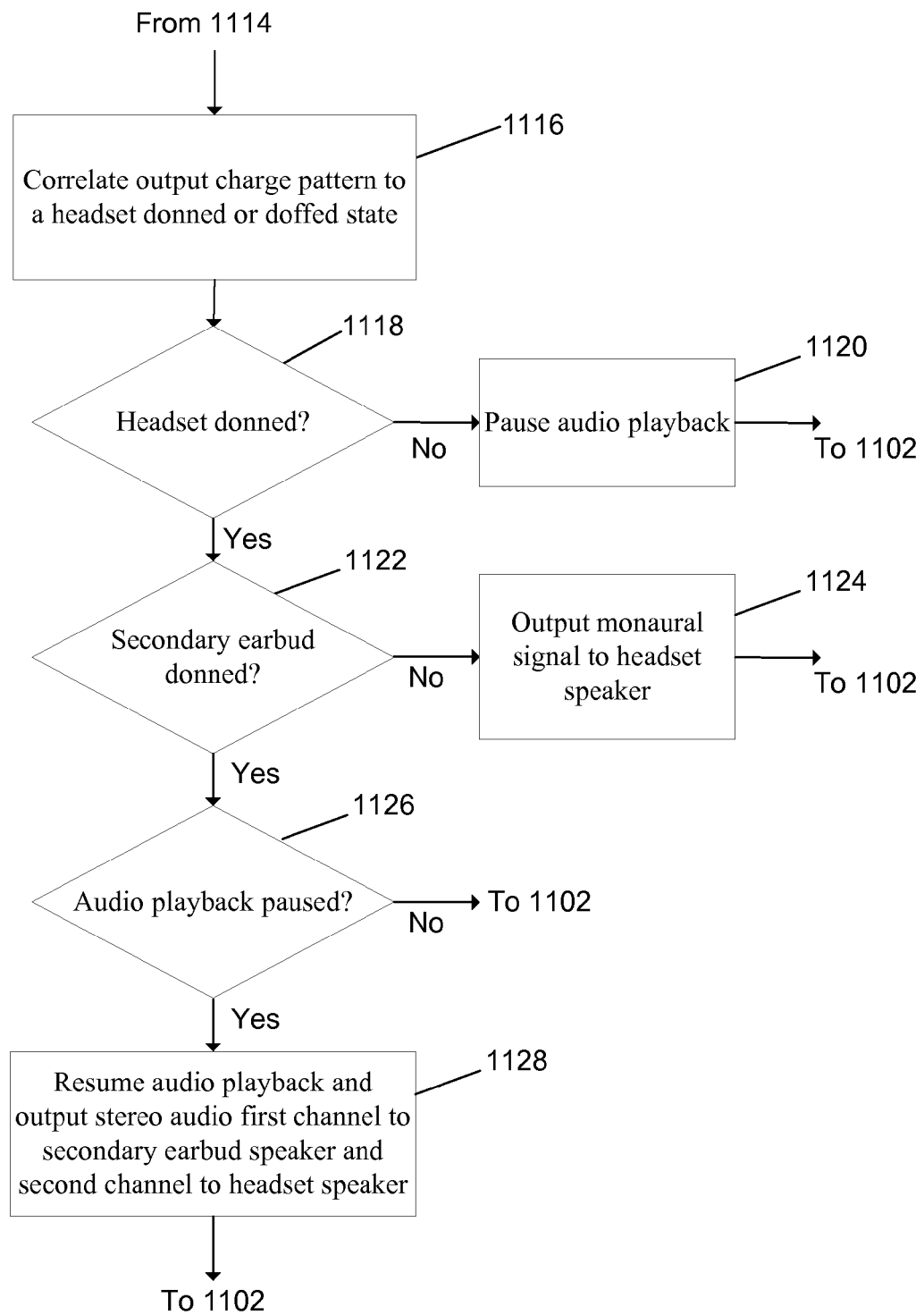

FIGS. 11A and 11B are a flowchart showing a method of controlling playback of an audio file based upon a donned or doffed state of both an earbud and a headset in a further example. At block 1102, a secondary earbud characteristic, such as kinetic energy, temperature, and/or capacitance, is detected by a detector. At block 1104, the detector provides an output charge corresponding to a detected characteristic. The output charge is amplified and transferred to a donned and doffed determination circuit. At block 1106, a plurality of output charges are processed by the determination circuit to determine an output charge pattern. At block 1108, the determination circuit correlates the output charge pattern to a donned or doffed state of the secondary earbud, in one example comparing the output charge pattern to predetermined output charge profiles that reflect a donned or doffed state of a secondary earbud. The predetermined output charge profiles may be in look-up tables or a database and may include a variety of parameters, such as for particular headsets and headphones and detectors being used.

At block 1110, a headset characteristic, such as kinetic energy, temperature, and/or capacitance, is detected by a detector. At block 1112, the detector provides an output charge corresponding to a detected characteristic. The output charge is amplified and transferred to a donned and doffed determination circuit. At block 1114, a plurality of output charges are processed by the determination circuit to determine an output charge pattern. At block 1116, the determination circuit correlates the output charge pattern to a donned or doffed state of the headset, in one example comparing the output charge pattern to predetermined output charge profiles that reflect a donned or doffed state of a headset. Blocks 1110 to 1116 may be performed simultaneously with blocks 1102 to 1108.

At decision block 1118, it is determined whether the headset is donned. If no at decision block 1118, playback of audio is paused at block 1120 and the process returns to block 1102. If yes at decision block 1118, at decision block 1122 it is determined whether the secondary earbud is donned. If no at decision block 1122, then at block 1124 a monaural audio signal is output to the headset speaker and the process returns to block 1102. If yes at decision block 1122, at decision block 1126 it is determined if audio playback is currently paused. If no at decision block 1126, then the process returns to block 1102. If yes at decision block 1126, then at block 1128 audio playback to the headset speaker and earbud speaker is resumed and a stereo audio first channel is output to the secondary earbud speaker and a stereo audio second channel is output to the headset speaker. The process then returns to block 1102.

Figure 12:
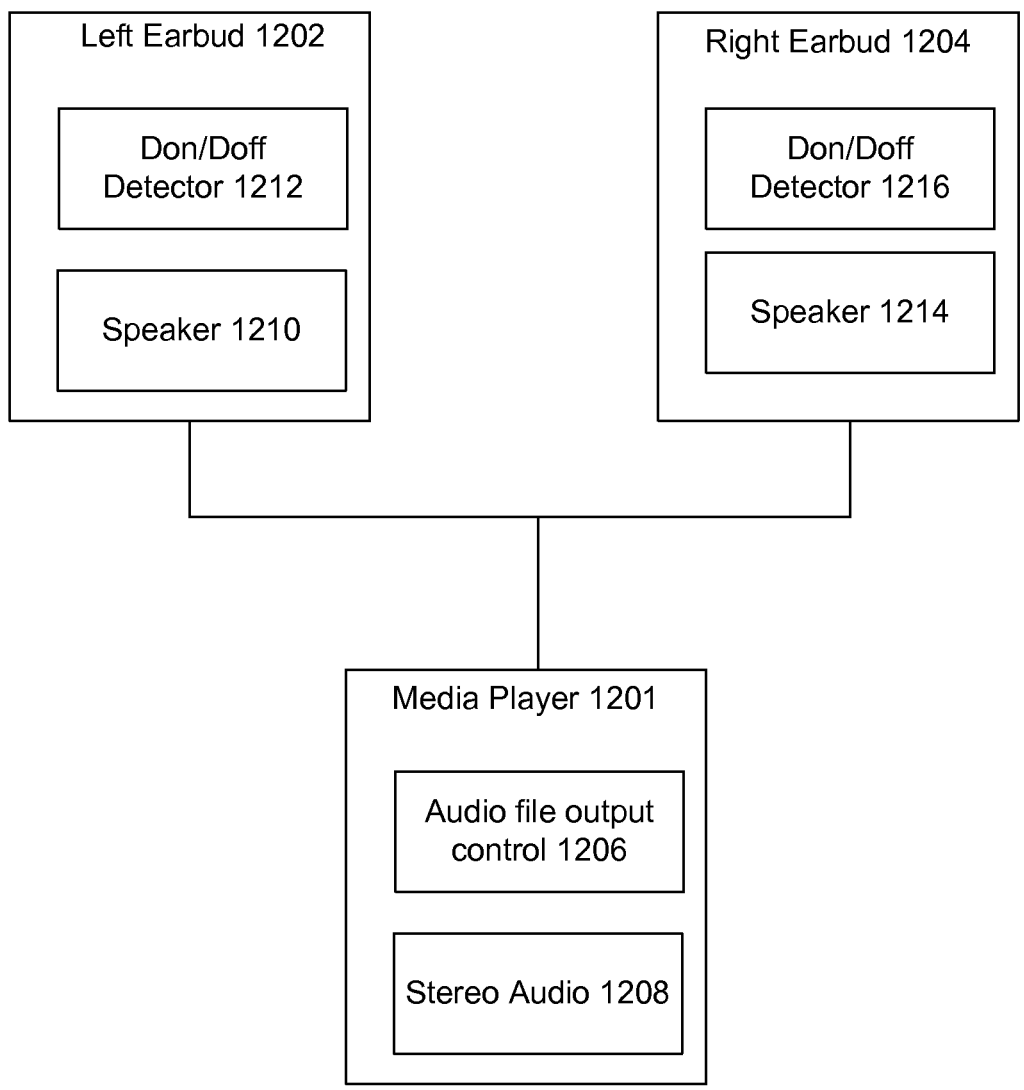
FIG. 12 illustrates an example where a media player that provides an audio signal is remote from both a left earbud and right earbud.

FIG. 12 illustrates an example system 1200 where a media player 1201 that provides an audio signal is remote from both a left earbud 1202 and right earbud 1204. For example, media player 1201 may be any digital music player. Media player 1201 includes an audio file output control application 1206 and stereo audio 1208 for playback. Left earbud 1202 includes a speaker 1210 and don/doff detector 1212. Right earbud 1204 includes a speaker 1214 and don/doff detector 1216. Media player is coupled to left earbud 1202 and right earbud 1204 using either a wired or wireless link. Operation of and usage states for system 1200 are as described above in reference to FIGS. 9-11, where the left earbud 1202 replaces the secondary earbud and the right earbud 1204 replaces the headset.

Figure 13A:
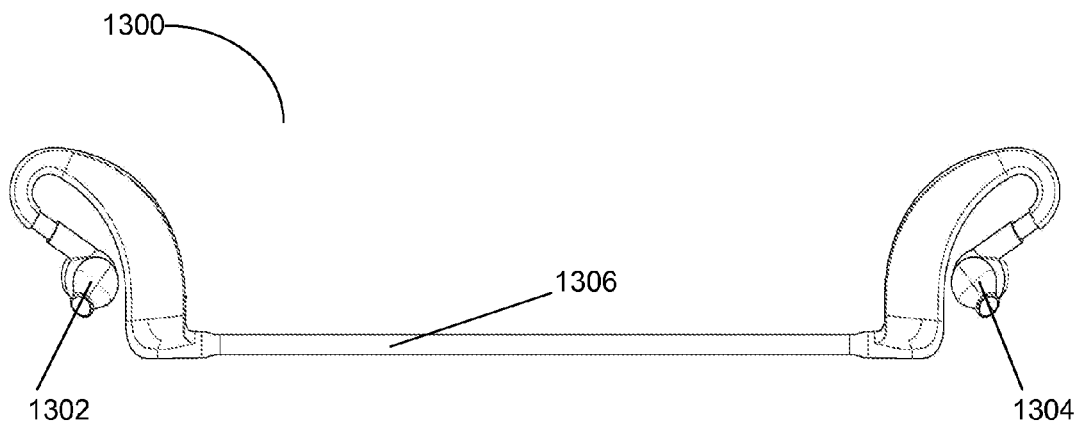
FIG. 13A and FIG. 13B illustrate a front view and rear view, respectively, of a headset system in one example.
Figure 13B:
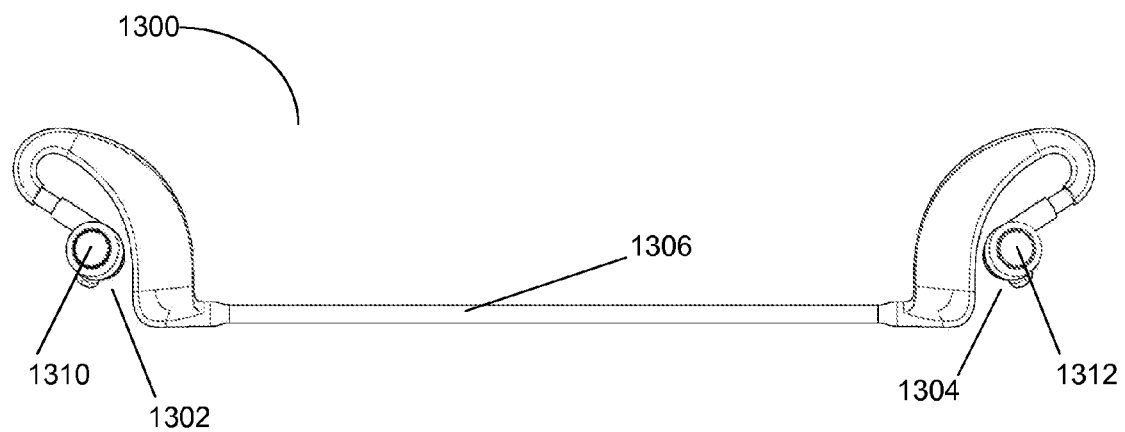

Referring now to FIG. 13A and FIG. 13B, a headset system 1300 includes an earbud 1302 and an earbud 1304. FIG. 13A illustrates a front view of headset system 1300. Earbud 1302 and earbud 1304 are coupled by a connector 1306. In one example, connector 1306 is a flexible electrical cable. The rigidity of the flexible electrical cable may be varied. Within earbud 1302 and earbud 1304 is a speaker for outputting sound into the ear of a user. Headset system 1300 also includes a microphone for receiving user speech. Although the examples herein refer to the use of an earbud form factor, other form factors known in the art for outputting an audio signal to a user ear may be used, such as an over-the-ear form factor. Referring to FIG. 13B, a rear view of headset system 1300 is shown. In one example usage state, the outward external facing surface 1310 of earbud 1302 includes a speaker for outputting sound when earbud 1302 is not inserted into a user ear and the outward external facing surface 1312 of earbud 1304 includes a speaker for outputting sound when earbud 1304 is not inserted into a user ear. This and other usage states are described further below. Although illustrated as a wireless headset, headset system 1300 may also be a corded headset. Furthermore, although a headset system 1300 is referred to and described as a telecommunications headset in certain examples, the examples described herein throughout are applicable to headphones (also referred to as earphones, stereophones, headsets, and earbuds) having listen only functionality.

Figure 14:
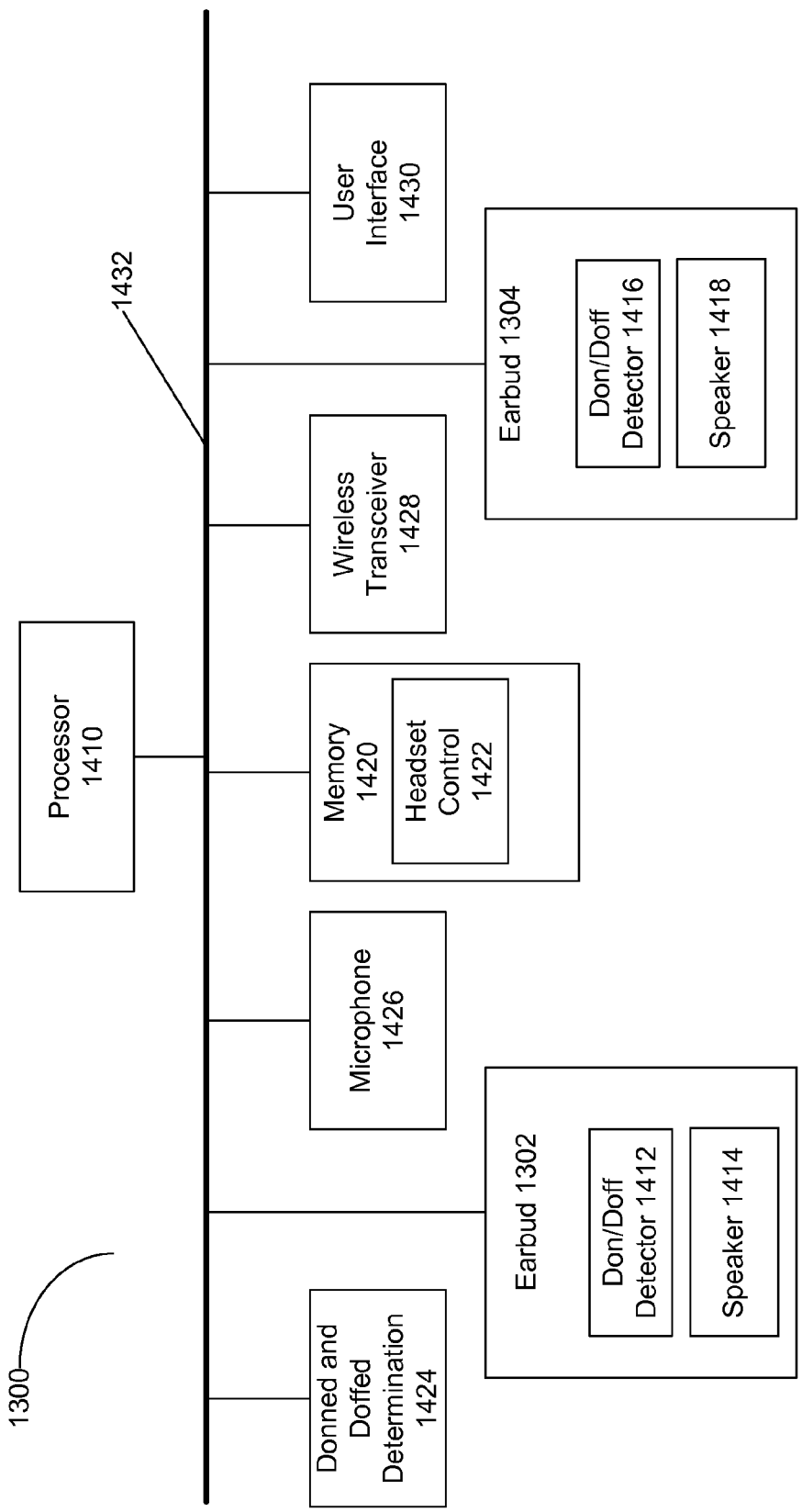
FIG. 14 shows a simplified block diagram of the headset system shown in FIG. 13A and FIG. 13B in one example.

FIG. 14 shows a simplified block diagram of the headset system 1300 shown in FIG. 13A and FIG. 13B in one example. Headset system 1300 includes a processor 1410 operably coupled via a bus 1432 to a donned and doffed determination circuit 1424, memory 1420, microphone 1426, wireless transceiver 1428, user interface 1430, earbud 1302, and earbud 1304. Earbud 1302 includes a don/doff detector 1412 and speaker 1414. Earbud 1304 includes a don/doff detector 1416 and speaker 1418. Wireless transceiver 1428 may, for example, be a Bluetooth transceiver. A headset control application 1422 resides in memory 406. Headset control application 1422 is executed by processor 1410.

Processor 1410 allows for processing data, in particular managing data between earbud 1302, earbud 1304, headset control application 1422, donned and doffed determination circuit 1424, user interface 1430, wireless transceiver 1428, microphone 1426, and memory 1420. In one example, donned and doffed determination circuit 1424 receives an output signal from the donned and doffed detector 1412 at earbud 1302 and determines the donned or doffed state of earbud 1302. Donned and doffed determination circuit 1424 also receives an output signal from the donned and doffed detector 1416 at earbud 1304 and determines the donned or doffed state of earbud 1304. Examples of processor 1410, don/doff detector 1412, don/doff detector 1416, donned and doffed determination circuit 1424, and memory 1420 include those as described herein in reference to FIG. 4 and FIGS. 5A-5G.

In one example, memory 1420 may store donned and doffed determination circuit 1424, output charges and patterns thereof from don/doff detector 1412 and don/doff detector 1416, and predetermined output charge profiles for comparison to determine the donned and doffed state of earbud 1302 and earbud 1304.

User interface 1430 allows for communication between the headset user and the headset, and in one example includes an audio and/or visual interface such that a prompt may be provided to the user's ear and/or an LED may be lit. User interface 1430 may include buttons or touch sensors to receive call answer, power on/off, menu navigation, or multimedia output control user input actions.

In one example, headset control application 1422 is operable to process an audio signal for output to the user responsive to the don/doff detector 1412 output and/or the don/doff detector 1416 output. The audio signal is processed responsive to whether the don/doff detector 1412 output indicates a donned or doffed state and whether the don/doff detector 1416 output indicates a donned or doffed state. The audio signal may be any audio output from the headset through speaker 1414 or speaker 1418 to be heard by the user. For example, the audio signal may be a ringer signal notifying the user of an incoming call or message, an earcon signal, a voice communication signal containing speech received by the headset, or a music signal.

The audio signal processing may take a variety of forms. In one example, the gain of the audio signal is modified responsive to the don/doff detector 1412 output and/or the don/doff detector 1416 output. In one application, ringer tones for incoming calls, earcons giving headset state information such as low battery state or out-of-range state, or spoken cues, are played in-the-ear when the headset is donned, and are played at a louder volume when the headset is doffed, thereby allowing the using to hear the audio signal when the headset is doffed.

In one application, a soft mute is performed when the headset is switched from a doffed state to a donned state, whereby a high volume output is quieted when donned. The headset automatically lowers the volume making it more comfortable and possibly safer for the user. Therefore, as a user moves a headset or headphones from a body worn stowage or resting mode and places them on his or her ear or ears, and the playing receive audio is at a high volume, the volume drops to protect the user from accidentally subjecting him/herself to unexpected high volume.

In one example, the audio signal processing includes switching the routing of the audio signal to the first speaker, the second speaker, or both the first speaker and second speaker responsive to the don/doff detector 1412 output and/or the don/doff detector 1416 output. Where the audio signal is routed to only speaker 1414 or speaker 1418, but not both, and the audio signal is a stereo signal, the left and right stereo channels may be mixed to form a single channel as described in previous examples herein.

In another example, the audio signal processing includes sound conditioning. The headset or headphone donned or doffed detection is used to initiate alternate digital signal processing settings to adjust the received sound frequency equalization to make the audio signal more intelligible or comfortable for listening.

In a further example, headset control application 1422 is operable to activate or deactivate operation of the microphone 1426, speaker 1414, or speaker 1418 responsive to the don/doff detector 1412 output and/or the don/doff detector 1416 output. In one application, battery life is improved by turning off receive audio to speaker 1414 or speaker 1418 when the corresponding earbud is doffed. In a further application, when the headset is doffed, the microphone is muted to avoid accidental transmit.

In a further example, headset control application 1422 automates user interface actions responsive to the don/doff detector 1412 output and/or the don/doff detector 1416 output. In one application, a call answer command is automated when the don/doff detector 1412 output and/or the don/doff detector 1416 indicate a donned condition and/or a transition from a doffed condition to a donned condition. In this manner, the user is not required to locate and initiate a call answer command such as a user interface button or touch sensor on the headset housing when the headset is donned.

In one application, device state data output to the user is automated when the don/doff detector 1412 output and/or the don/doff detector 1416 output indicate a donned condition. In one application, a device state alert audio signal is output to the user revealing headset state. For example, when the headset is on mute and donned, the headset outputs a spoken cue "headset muted", an earcon, or in the case of a wireless headset, an audio message letting the user know whether the headset is currently paired with a host device.

In one application, a playback pause command is automated when the don/doff detector 1412 output and/or the don/doff detector 1416 output indicates a doffed condition. In this manner, the user is not required to locate and initiate a pause command such as a user interface button on the headset housing when the user doffs the headset.

Figure 15:
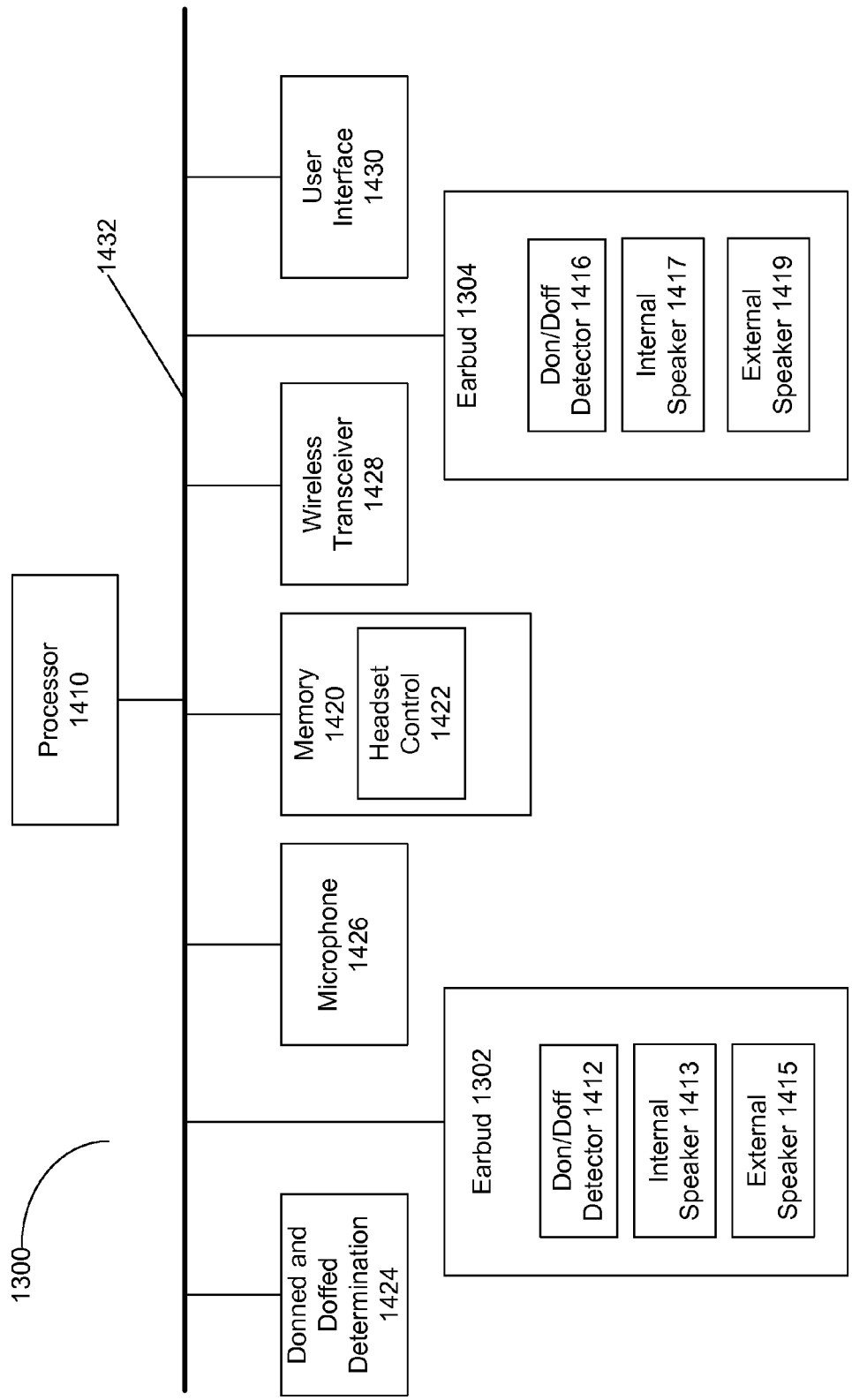
FIG. 15 shows a simplified block diagram of the headset system shown in FIG. 13A and FIG. 13B in a further example.

Referring now to FIG. 15, a further example of a headset system 1300 is illustrated. Headset system 1300 shown in FIG. 15 is substantially similar to that shown in FIG. 14, except that earbud 1302 includes both an internal speaker 1413 and an external speaker 1415 and earbud 1304 includes both an internal speaker 1417 and an external speaker 1419. While internal speaker 1413 and internal speaker 1417 are designed to output audio to the user ear while in-the-ear or over-the-ear of the user, or in close proximity to the user ear canal, external speaker 1415 and external speaker 1419 are designed to output audio with sufficient loudness to be heard by the user when headset system 1300 is worn around the user neck, over the shoulder, or otherwise on the user body or close proximity to the user body.

Headset control application 1422 is operable to process an audio signal for output to the user responsive to the don/doff detector 1412 output and/or the don/doff detector 1416 output. Additional applications are possible using additional output transducers such as external speaker 1415 and external speaker 1519. The output transducer may be switched based on the donned or doffed state.

In one example, routing of an audio signal to the internal speaker 1413, external speaker 1415, internal speaker 1417, and external speaker 1419 is switched responsive to the don/doff detector 1412 output and/or the don/doff detector 1416 output. In one application, the audio signal is routed to internal speaker 1413 and internal speaker 1417 when earbud 1302 and earbud 1304 are donned, and the audio signal is routed to external speaker 1415 and external speaker 1419 when earbud 1302 and earbud 1304 are doffed. In one application, ringer tones for incoming calls, earcons giving headset state information such as low battery state or out-of-range state, or spoken cues, are played in the ear through internal speakers 1413, 1417 when the headset is donned, and through the external speakers 1415, 1419 when the headset is doffed. In a further example, other output transducers such as a buzzer or audio transducer may be used in alternative to external speakers 1415, 1419 when the headset is doffed.

In one example, the frequency equalization of the audio signal is modified responsive to the don/doff detector 1412 output and/or the don/doff detector 1416 output. In one application, bass frequencies of the audio signal are boosted when the headset is doffed and the audio signal is output through external speakers 1415, 1419.

In a further example, headset control application 1422 is operable to activate or deactivate operation of the microphone 1426, internal speaker 1413, external speaker 1415, internal speaker 1417, or external speaker 1519 responsive to the don/doff detector 1412 output and/or the don/doff detector 1416 output.

Figure 16A:
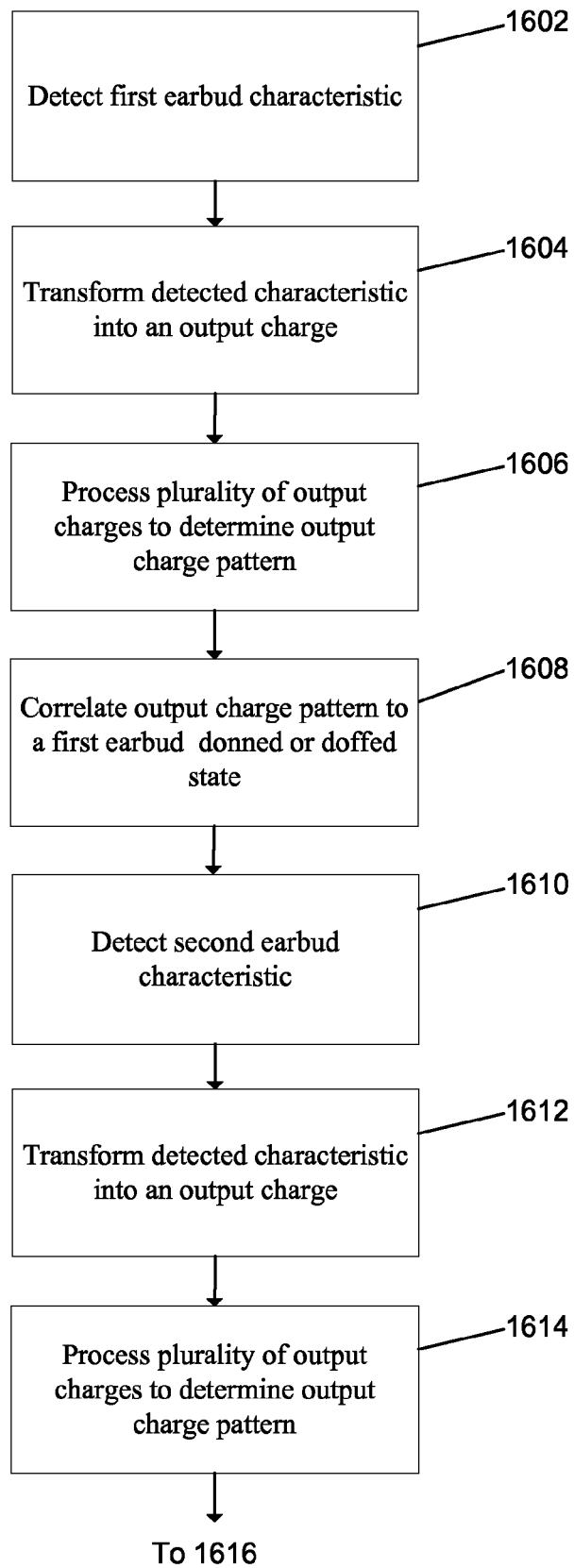
FIGS. 16A and 16B are a flowchart showing a method of operating a headset by processing an audio signal responsive to a first earbud donned or doffed state and/or a second earbud donned or doffed state.
Figure 16B:
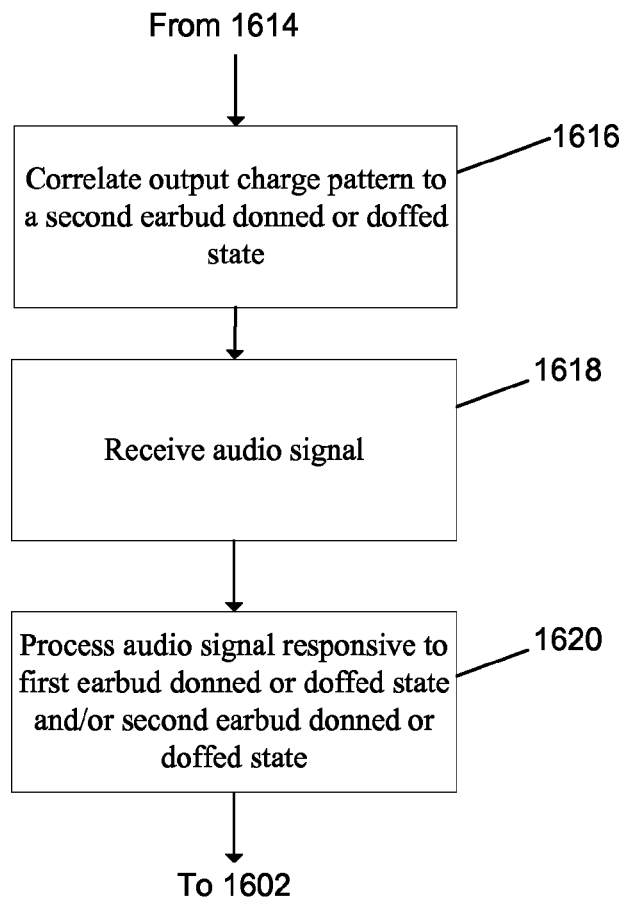

FIGS. 16A and 16B are a flowchart showing a method of operating a headset by processing an audio signal responsive to a first earbud donned or doffed state and/or a second earbud donned or doffed state. At block 1602, a first earbud characteristic, such as kinetic energy, temperature, and/or capacitance, is detected by a detector. At block 1604, the detector provides an output charge corresponding to a detected characteristic. The output charge is amplified and transferred to a donned and doffed determination circuit. At block 1606, a plurality of output charges are processed by the determination circuit to determine an output charge pattern. At block 1608, the determination circuit correlates the output charge pattern to a donned or doffed state of the first earbud, in one example comparing the output charge pattern to predetermined output charge profiles that reflect a donned or doffed state of a first earbud. The predetermined output charge profiles may be in look-up tables or a database and may include a variety of parameters, such as for particular headsets and headphones and detectors being used.

At block 1610, a second earbud characteristic, such as kinetic energy, temperature, and/or capacitance, is detected by a detector. At block 1612, the detector provides an output charge corresponding to a detected characteristic. The output charge is amplified and transferred to a donned and doffed determination circuit. At block 1614, a plurality of output charges are processed by the determination circuit to determine an output charge pattern. At block 1616, the determination circuit correlates the output charge pattern to a donned or doffed state of the second earbud, in one example comparing the output charge pattern to predetermined output charge profiles that reflect a donned or doffed state of a second earbud. Blocks 1610 to 1616 may be performed simultaneously with blocks 1602 to 1608.

At block 1618, an audio signal is received. At block 1620, the audio signal is processed responsive to the first earbud donned or doffed state and/or the second earbud donned or doffed state. The process then returns to block 1602.

In one example at block 1620, processing the audio signal responsive to the first earbud donned or doffed state and/or the second earbud donned or doffed state includes modifying a gain of the audio signal. In one application, if at block 1608 it is determined that the first earbud is doffed and at block 1616 it is determined the second earbud is doffed, the audio signal gain is increased.

In one example at block 1620, processing the audio signal responsive to the first earbud donned or doffed state and/or the second earbud donned or doffed state includes modifying a frequency equalization of the audio signal. In another example at block 1620, processing the audio signal responsive to the first earbud donned or doffed state and/or the second earbud donned or doffed state includes switching the routing of the audio signal to a first earbud speaker, second earbud speaker, or both the first earbud speaker and second earbud speaker.

In a further example at block 1620, processing the audio signal responsive to the first earbud donned or doffed state and/or the second earbud donned or doffed state includes switching the routing of the audio signal from a first earbud system in-the-ear speaker or second earbud system in-the-ear speaker to a first earbud system out-of-the-ear external speaker or second earbud system out-of-the ear external speaker. In one application, if at block 1608 it is determined that the first earbud is doffed and at block 1616 it is determined the second earbud is doffed, the routing of the audio signal is switched from the in-the-ear speakers to the out-of-the-ear external speakers of the first and second earbud, respectively.

Figure 17A:
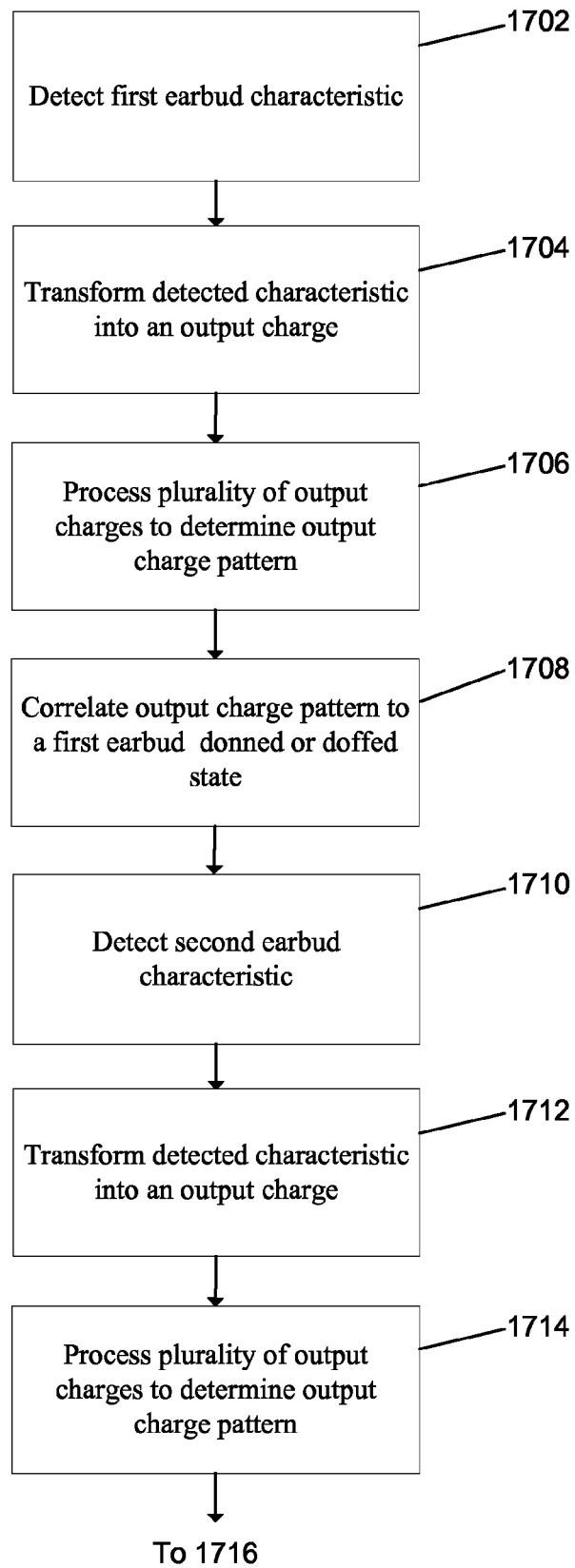
FIGS. 17A and 17B are a flowchart showing a method of operating a headset by activating or deactivating a headset component responsive to a first earbud donned or doffed state and/or a second earbud donned or doffed state.
Figure 17B:
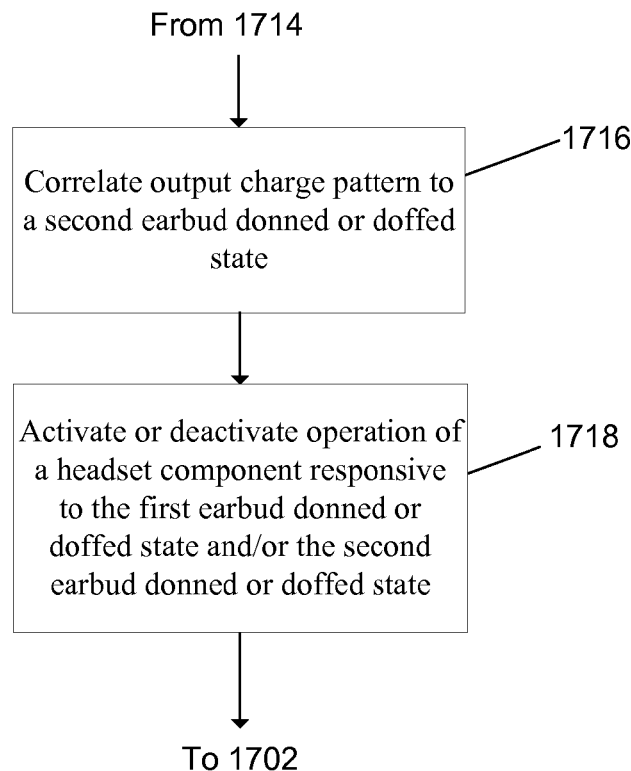

FIGS. 17A and 17B are a flowchart showing a method of operating a headset by activating or deactivating a headset component responsive to a first earbud donned or doffed state and/or a second earbud donned or doffed state. At block 1702, a first earbud characteristic, such as kinetic energy, temperature, and/or capacitance, is detected by a detector. At block 1704, the detector provides an output charge corresponding to a detected characteristic. The output charge is amplified and transferred to a donned and doffed determination circuit. At block 1706, a plurality of output charges are processed by the determination circuit to determine an output charge pattern. At block 1708, the determination circuit correlates the output charge pattern to a donned or doffed state of the first earbud, in one example comparing the output charge pattern to predetermined output charge profiles that reflect a donned or doffed state of a first earbud. The predetermined output charge profiles may be in look-up tables or a database and may include a variety of parameters, such as for particular headsets and headphones and detectors being used.

At block 1710, a second earbud characteristic, such as kinetic energy, temperature, and/or capacitance, is detected by a detector. At block 1712, the detector provides an output charge corresponding to a detected characteristic. The output charge is amplified and transferred to a donned and doffed determination circuit. At block 1714, a plurality of output charges are processed by the determination circuit to determine an output charge pattern. At block 1716, the determination circuit correlates the output charge pattern to a donned or doffed state of the second earbud, in one example comparing the output charge pattern to predetermined output charge profiles that reflect a donned or doffed state of a second earbud. Blocks 1710 to 1716 may be performed simultaneously with blocks 1702 to 1708. At block 1718, a headset component is activated or deactivated responsive to the first earbud donned or doffed state and/or the second earbud donned or doffed state. The process then returns to block 1702.

In one example at block 1718, activating or deactivating a headset component responsive to the first earbud donned or doffed state and/or the second earbud donned or doffed state includes activating or deactivating the headset microphone. In one application, the headset microphone is deactivated if the first earbud and second earbud are doffed.

In another example at block 1718, activating or deactivating a headset component responsive to the first earbud donned or doffed state and/or the second earbud donned or doffed state includes activating or deactivating the headset speaker or speakers. In one application, the headset speakers are deactivated when the first earbud and second earbud are doffed.

Figure 18A:
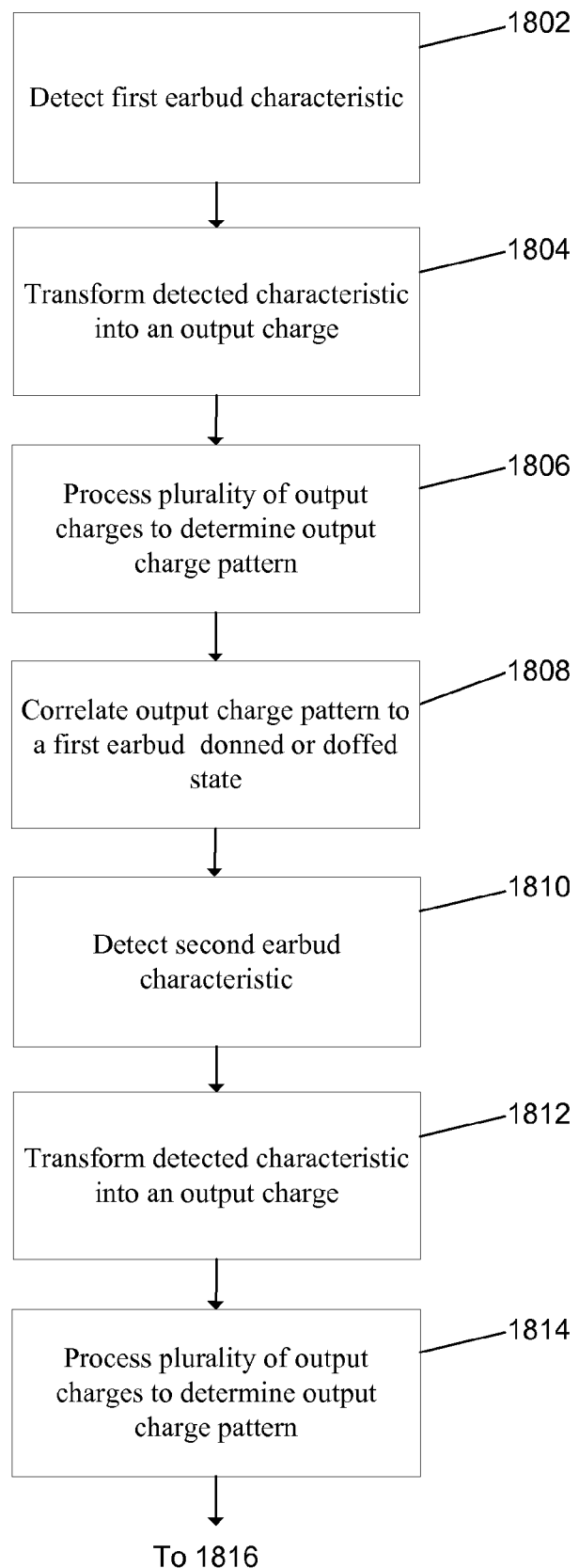
FIGS. 18A and 18B are a flowchart showing a method of operating a headset by automating a user interface action responsive to a first earbud donned or doffed state and/or a second earbud donned or doffed state.
Figure 18B:
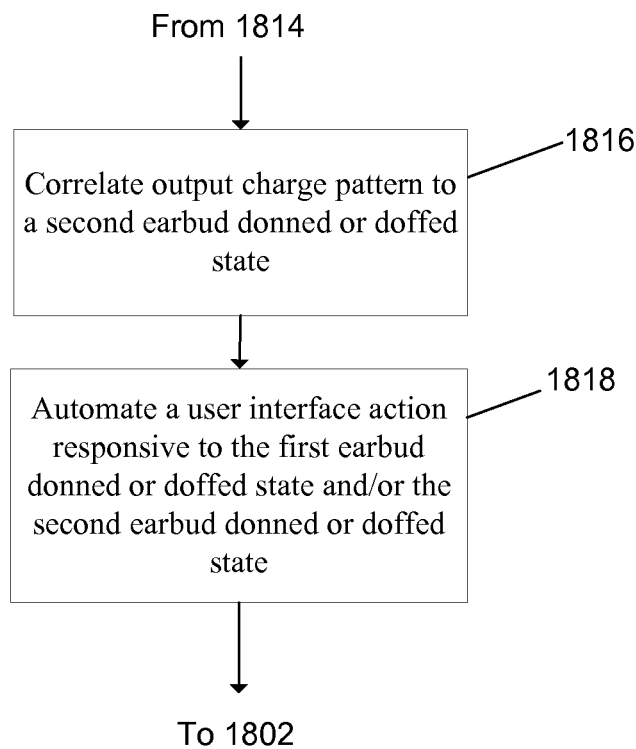

FIGS. 18A and 18B are a flowchart showing a method of operating a headset by automating a user interface action responsive to a first earbud donned or doffed state and/or a second earbud donned or doffed state. At block 1802, a first earbud characteristic, such as kinetic energy, temperature, and/or capacitance, is detected by a detector. At block 1804, the detector provides an output charge corresponding to a detected characteristic. The output charge is amplified and transferred to a donned and doffed determination circuit. At block 1806, a plurality of output charges are processed by the determination circuit to determine an output charge pattern. At block 1808, the determination circuit correlates the output charge pattern to a donned or doffed state of the first earbud, in one example comparing the output charge pattern to predetermined output charge profiles that reflect a donned or doffed state of a first earbud. The predetermined output charge profiles may be in look-up tables or a database and may include a variety of parameters, such as for particular headsets and headphones and detectors being used.

At block 1810, a second earbud characteristic, such as kinetic energy, temperature, and/or capacitance, is detected by a detector. At block 1812, the detector provides an output charge corresponding to a detected characteristic. The output charge is amplified and transferred to a donned and doffed determination circuit. At block 1814, a plurality of output charges are processed by the determination circuit to determine an output charge pattern. At block 1816, the determination circuit correlates the output charge pattern to a donned or doffed state of the second earbud, in one example comparing the output charge pattern to predetermined output charge profiles that reflect a donned or doffed state of a second earbud. Blocks 1810 to 1816 may be performed simultaneously with blocks 1802 to 1808. At block 1818, a user interface action is automated responsive to the first detector output and/or the second detector output. The process then returns to block 1802.

In one application at block 1818, automating a user interface action responsive to the first detector output and/or the second detector output includes automating a call answer command upon receipt of a call when the first detector output or second detector output indicate a donned condition and/or a transition from a doffed condition to a donned condition. In another application at block 1818, automating a user interface action responsive to the first detector output and/or the second detector output includes automating device state data output when the first detector output or second detector output indicate a donned condition. In a further application at block 1818, automating a user interface action responsive to the first detector output and/or the second detector output includes automating a playback pause command upon receipt of a call when the first detector output or second detector output indicate a donned condition.

The various examples described above are provided by way of illustration only and should not be construed to limit the invention. The term "or" is used herein to mean "and/or". Based on the above discussion and illustrations, those skilled in the art will readily recognize that various modifications and changes may be made to the present invention without strictly following the exemplary embodiments and applications illustrated and described herein. For example, the methods and systems described herein may be applied to other body worn devices in addition to headsets and headphones. Furthermore, the functionality associated with any blocks described above may be centralized or distributed. It is also understood that one or more blocks of the headset may be performed by hardware, firmware or software, or some combinations thereof. Such modifications and changes do not depart from the true spirit and scope of the present invention that is set forth in the following claims.

While the exemplary embodiments of the present invention are described and illustrated herein, it will be appreciated that they are merely illustrative and that modifications can be made to these embodiments without departing from the spirit and scope of the invention. Thus, the scope of the invention is intended to be defined only in terms of the following claims as may be amended, with each claim being expressly incorporated into this Description of Specific Embodiments as an embodiment of the invention.

What we claim:

1. A headset system comprising:
    a detector providing a detector output indicating a headset donned condition or a headset doffed conditioned;
    a speaker;
    a microphone;
    a memory storing an audio control application; and
    a processor for executing the headset control application, wherein the headset control application mutes the microphone responsive to the detector output.

2. The headset system of claim 1, wherein the headset control application mutes the microphone when the detector outputs indicates a doffed condition.

3. The system of claim 1, wherein the headset control application deactivates the microphone when the detector outputs indicates a doffed condition.

4. The system of claim 1, wherein the headset control application mutes the microphone when the detector output indicates a transition from a donned condition to a doffed condition.

5. A method of operating a headset system, the method comprising:
    providing a headset;
    outputting a detector output indicating the headset in a donned condition or doffed condition; and
    muting the headset's microphone responsive to the detector output.

6. The method of claim 5, wherein muting the headset's microphone responsive to the detector output comprises muting the microphone when the detector output indicates a doffed condition.

7. The method of claim 5, wherein muting the headset's microphone responsive to the detector output comprises muting the microphone when the detector output indicates a transition from a donned condition to a doffed condition.

8. A headset system comprising:
    a first earbud system comprising:
    a first detector providing a first detector output indicating a first earbud donned condition or a first earbud doffed condition; and
    a first speaker;
    a second earbud system comprising:
    a second detector providing a second detector output indicating a second earbud donned condition or a second earbud doffed condition; and
    a second speaker;
    a microphone;
    a memory storing a headset controller application; and
    a processor for executing the headset controller application, wherein the headset controller application mutes the microphone responsive to the first detector output and/or the second detector output.

9. The headset system of claim 8, wherein the headset controller application mutes the microphone responsive to the first detector output indicating a first earbud doffed condition.

10. The headset system of claim 8, wherein the headset controller application mutes the microphone responsive to the second detector output indicating a second earbud doffed condition.

11. The headset system of claim 8, wherein the headset controller application mutes the microphone responsive to the first detector output indicating a first earbud doffed condition and the second detector output indicating a second earbud doffed condition.

12. A method for operating a headset comprising a first earbud system, a second earbud system and a microphone, the method comprising:

outputting a first detector output, the first detector output indicating a first earbud system donned condition or a first earbud system doffed condition;

outputting a second detector output, the second detector output indicating a second earbud system donned condition or a second earbud system doffed condition;

muting the microphone responsive to the first detector output and/or the second detector output.

13. The method of claim 12, wherein muting the microphone comprises muting the microphone responsive to the first detector output indicating a first earbud system doffed condition.

14. The method of claim 12, wherein muting the microphone comprises muting the microphone responsive to the second detector output indicating a second earbud system doffed condition.

15. The method of claim 12, wherein muting the microphone comprises muting the microphone responsive to the first detector output indicating a first earbud system doffed condition and the second detector output indicating a second earbud system doffed condition.

* * * * *